US012727468B2

(12) United States Patent
Kuo et al.

(10) Patent No.: US 12,727,468 B2
(45) Date of Patent: Sep. 1, 2026

(54) INTERCONNECT STRUCTURE PATTERN

(71) Applicant: Taiwan Semiconductor Manufacturing Company, Ltd., Hsinchu (TW)

(72) Inventors: Fu-Chiang Kuo, Hsinchu City (TW); Guan Yu Chen, New Taipei City (TW); Hsin-Liang Chen, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 665 days.

(21) Appl. No.: 17/819,678

(22) Filed: Aug. 15, 2022

(65) Prior Publication Data

US 2023/0352404 A1 Nov. 2, 2023

Related U.S. Application Data

(60) Provisional application No. 63/337,427, filed on May 2, 2022.

(51) Int. Cl.
*H10W 20/41* (2026.01)
*H10W 20/40* (2026.01)
(Continued)

(52) U.S. Cl.
CPC ......... *H10W 20/435* (2026.01); *H10W 20/40* (2026.01); *H10W 20/42* (2026.01); *H10W 90/736* (2026.01)

(58) Field of Classification Search
CPC ... H01L 24/32; H01L 23/485; H01L 23/5283; H01L 23/5226; H01L 23/522;
(Continued)

(56) References Cited

U.S. PATENT DOCUMENTS 6,261,883 B1 * 7/2001 Koubuchi ......... H01L 21/31053 257/776
6,614,049 B1 * 9/2003 Koyama ................ H01L 22/34 257/776
(Continued)

FOREIGN PATENT DOCUMENTS

TW 201917841 A 5/2019

OTHER PUBLICATIONS

Non-final Rejection Search Report, Feb. 20, 2025, 5 pages, Application No. 112110284, Taiwan.

*Primary Examiner* — Mouloucoulaye Inoussa
(74) *Attorney, Agent, or Firm* — Sterne, Kessler, Goldstein & Fox P.L.L.C.

(57) ABSTRACT

The present disclosure describes a structure with a substrate, a circuit element, a first metallization layer, and a second metallization layer. The circuit element is formed on the substrate. The first metallization layer is disposed over the substrate and includes a first metal line electrically connected to the circuit element and first dummy metal lines extending along a first direction. The second metallization layer is disposed directly above the first metallization layer and includes a second metal line electrically connected to the first metal line and second dummy metal lines extending along a second direction. The second direction is perpendicular to the first direction.

20 Claims, 17 Drawing Sheets

(51) Int. Cl.
*H10W 20/42* (2026.01)
*H10W 90/00* (2026.01)

(58) Field of Classification Search
CPC ............... H01L 23/544; H01L 23/3114; H01L 21/76829; H01L 21/76802; H01L 23/585; H01L 21/6836; H01L 23/562; H01L 24/13; H01L 24/29; H01L 24/05; H01L 24/20; H01L 24/11; H01L 23/5286; H01L 23/525; H01L 25/0655; H01L 23/528; H01L 23/3192; H01L 23/481; H01L 24/94; H01L 24/80; H01L 24/06; H01L 24/08; H01L 24/33; H01L 24/83; H01L 24/03; H01L 23/53295; H01L 25/0657; H01L 24/09; H01L 25/50; H01L 2224/32258; H01L 2224/48091; H01L 2224/32225; H01L 2924/15174; H01L 2224/73265; H01L 2221/68336; H01L 2924/15311; H01L 2223/54426; H01L 2224/48227; H01L 2924/181; H01L 2924/00012; H01L 2924/00014; H01L 2224/02166; H01L 2224/13109; H01L 2224/13169; H01L 2224/13083; H01L 2224/1312; H01L 2224/13111; H01L 2224/13116; H01L 2924/14; H01L 2224/0557; H01L 2224/13144; H01L 2224/13155; H01L 2224/80896; H01L 2225/06593; H01L 2224/05551; H01L 2224/80895; H01L 2224/80357; H01L 2224/80948; H01L 2225/06524; H01L 2224/05555; H01L 2224/05687; H01L 2224/06132; H01L 2224/08145; H01L 2225/06568; H01L 2224/06131; G06F 30/394; G06F 30/392; G06F 2119/06; H10D 89/10; H10D 62/116; H10D 84/834; H10D 62/115
See application file for complete search history.

(56) References Cited

U.S. PATENT DOCUMENTS

| | | | | |
|---|---|---|---|---|
| 9,105,490 | B2 | 8/2015 | Wang et al. | |
| 9,236,267 | B2 | 1/2016 | De et al. | |
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 11,080,455 | B1 * | 8/2021 | Hu | G06F 30/394 |
| 11,121,047 | B2 * | 9/2021 | Shu | H01L 23/528 |
| 11,848,285 | B2 * | 12/2023 | Park | H01L 23/562 |
| 2004/0084777 | A1 * | 5/2004 | Yamanoue | H01L 24/05<br>257/E21.244 |
| 2004/0089915 | A1 * | 5/2004 | Nanjo | H01L 23/5258<br>257/E21.546 |
| 2005/0086617 | A1 * | 4/2005 | Ciplickas | H01L 22/20<br>324/750.3 |
| 2007/0013071 | A1 * | 1/2007 | Adkisson | H01L 24/06<br>257/758 |
| 2009/0294912 | A1 * | 12/2009 | Chibahara | H01L 23/02<br>257/E23.18 |
| 2011/0031581 | A1 * | 2/2011 | West | H01L 23/481<br>257/774 |
| 2012/0098105 | A1 * | 4/2012 | Adkisson | H01L 23/585<br>257/E23.194 |
| 2012/0326146 | A1 * | 12/2012 | Hui | H01L 22/32<br>257/E29.325 |
| 2013/0017669 | A1 * | 1/2013 | Kogawa | H01L 21/304<br>257/E21.599 |
| 2013/0020674 | A1 * | 1/2013 | Leal | H01L 23/585<br>257/E23.149 |
| 2013/0256906 | A1 * | 10/2013 | Mori | H01L 21/02697<br>257/774 |
| 2014/0319522 | A1 * | 10/2014 | Daubenspeck | H01L 24/03<br>257/737 |
| 2014/0353845 | A1 * | 12/2014 | Morita | H01L 23/5226<br>257/774 |
| 2015/0371957 | A1 * | 12/2015 | Wang | H01L 21/78<br>257/620 |
| 2017/0033041 | A1 * | 2/2017 | Morita | H01L 21/76819 |
| 2017/0169153 | A1 * | 6/2017 | Hwang | G06F 30/398 |
| 2018/0025991 | A1 * | 1/2018 | Koketsu | H10D 86/451<br>438/462 |
| 2018/0286911 | A1 * | 10/2018 | Kagawa | H10F 39/811 |
| 2019/0122951 | A1 * | 4/2019 | Chen | H01L 23/49822 |
| 2020/0058543 | A1 * | 2/2020 | Han | H01L 23/544 |
| 2021/0057361 | A1 * | 2/2021 | Isozaki | H01L 24/06 |
| 2021/0175133 | A1 * | 6/2021 | Choi | H01L 23/544 |
| 2021/0202472 | A1 * | 7/2021 | Thomson | H10D 89/921 |
| 2021/0320040 | A1 * | 10/2021 | Fu | H01L 25/0655 |
| 2022/0037206 | A1 * | 2/2022 | Sawada | H01L 21/268 |
| 2022/0299887 | A1 * | 9/2022 | Han | H01L 23/544 |
| 2022/0328526 | A1 * | 10/2022 | Liaw | H01L 23/5283 |
| 2024/0136311 | A1 * | 4/2024 | Jeon | H01L 24/06 |

* cited by examiner

100

170 160 150 140 130

110

Circuit Element 120

INTERCONNECT STRUCTURE PATTERN

CROSS-REFERENCE TO RELATED APPLICATION

This application claims the benefit of U.S. Provisional Patent Application No. 63/337,427, titled "Metal Pattern to Control Wafer Warpage," which was filed on May 2, 2022 and is incorporated herein by reference in its entirety.

BACKGROUND

With advances in semiconductor technology, there have been increasing demands for higher storage capacity, faster processing systems, higher performance, and lower costs. To meet these demands, the semiconductor industry continues to scale down the dimensions of circuit elements, such as three-dimensional transistors (e.g., gate-all-around field-effect transistors (GAAFETs) and fin field-effect transistors (finFETs)) and capacitors. As the number of circuit elements increases, interconnect structures to connect these elements to one another become increasingly more complex.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

FIG. 1 is an illustration of a cross-sectional view of a semiconductor structure with an interconnect structure having metal lines, dummy metal lines, and via structures, according to some embodiments.

FIGS. 5A and 5B are illustrations of top-level views of third patterns for interconnect structures for a semiconductor structure, according to some embodiments.

DETAILED DESCRIPTION

Figures 2A, 2B:
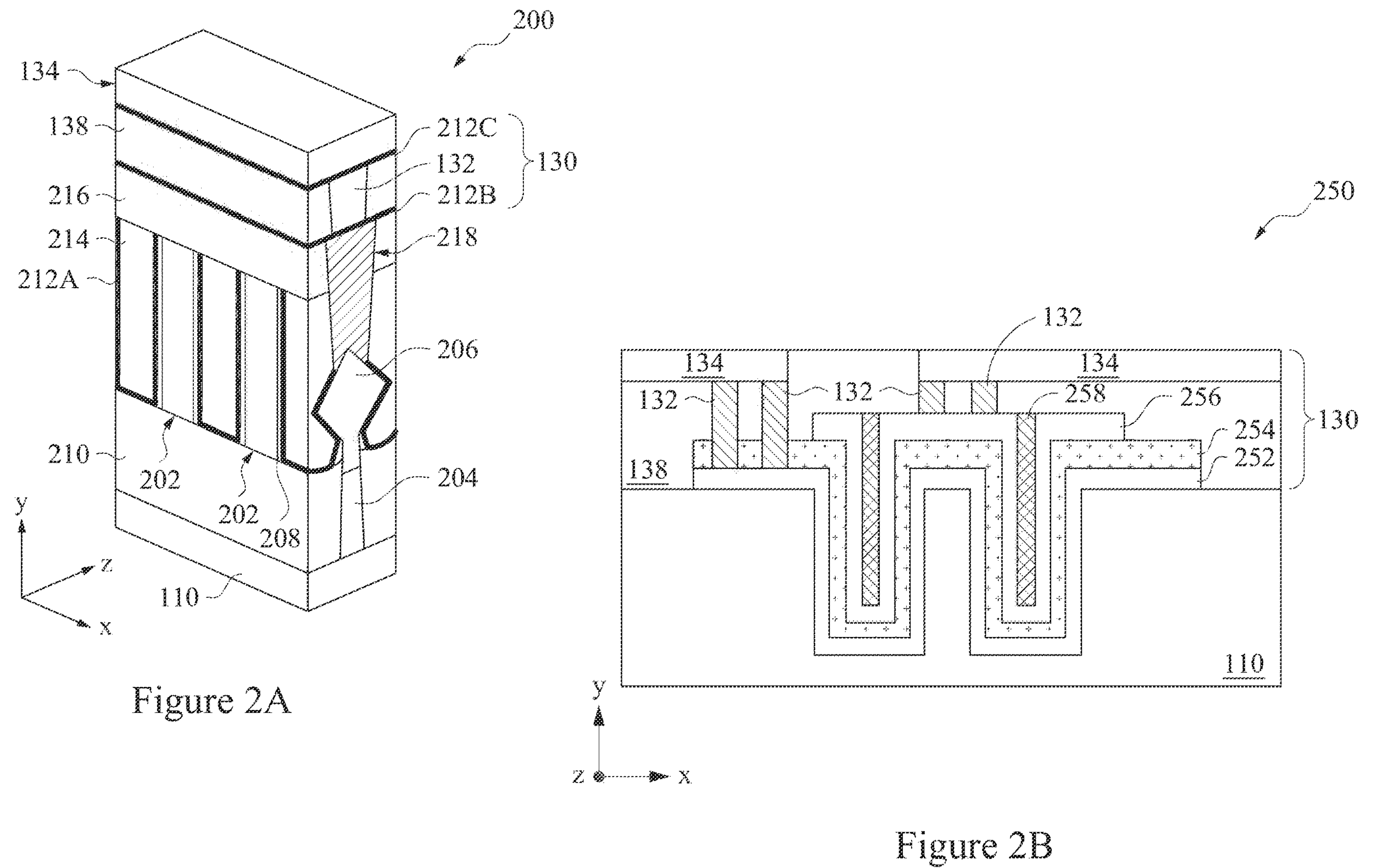
FIGS. 2A and 2B are illustrations of an isometric view of a transistor device and a cross-sectional view of a capacitor structure, respectively, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed. Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

With advances in semiconductor technology, there have been increasing demands for higher storage capacity, faster processing systems, higher performance, and lower costs. To meet these demands, the semiconductor industry continues to scale down the dimensions of circuit elements, such as three-dimensional transistors (e.g., GAAFETs and finFETs) and capacitors. As the number of circuit elements increases, interconnect structures to connect these elements to one another become increasingly more complex. For example, to support semiconductor structures with a high packing density of circuit elements, the number of metallization layers in interconnect structures increases to connect the high number of circuit elements to one another. The integration of metals (e.g., copper) in the interconnect structures can induce stress in the back end of line (BEOL) manufacturing process. And, with a higher number of metallization layers, the induced stress can cause wafer warpage.

The present disclosure describes semiconductor structures and methods to reduce wafer warpage due to stress caused by interconnect structures. In some embodiments, the semiconductor structures can include a substrate, a first metallization layer over the substrate, and a second metallization layer directly above the first metallization layer. The substrate can include one or more circuit elements formed thereon. The first metallization layer can include a first metal line electrically connected to the one or more circuit elements and first dummy metal lines extending along a first direction, in which the first metal line is electrically isolated from the first dummy metal lines. The second metallization layer can include a second metal line electrically connected to the first metal line and second dummy metal lines extending along a second direction. The first and second directions are perpendicular to one another. The second dummy metal lines are electrically isolated from the first metal line, the second metal line, and the first dummy metal lines.

For a third metallization layer directly above the second metallization layer, this metallization layer can include a third metal line that electrically connects to the second metal line and third dummy metal lines that follow the same pattern as the first dummy metal lines. For a fourth metallization layer directly above the third metallization layer, this metallization layer can include a fourth metal line that electrically connects to the third metal line and fourth dummy metal lines that follow the same pattern as the second dummy metal lines. And for subsequent odd-numbered metallization layers (e.g., fifth and seventh metallization layers), these metallization layers can include metal lines that electrically connect to metal lines below and dummy metal lines that follow the same pattern as the first and third dummy metal lines. For subsequent even-numbered metallization layers (e.g., sixth and eighth metallization layers), these metallization layers can include metal lines that electrically connect to metal lines below and dummy metal lines that follow the same pattern as the second and fourth dummy metal lines. With the directional arrangement of the dummy metal lines in the odd- and even-numbered metallization layers, tensile stress and stretching forces can be reduced in the BEOL manufacturing process, thus reducing wafer warpage (e.g., by over 50%).

Figure 1:
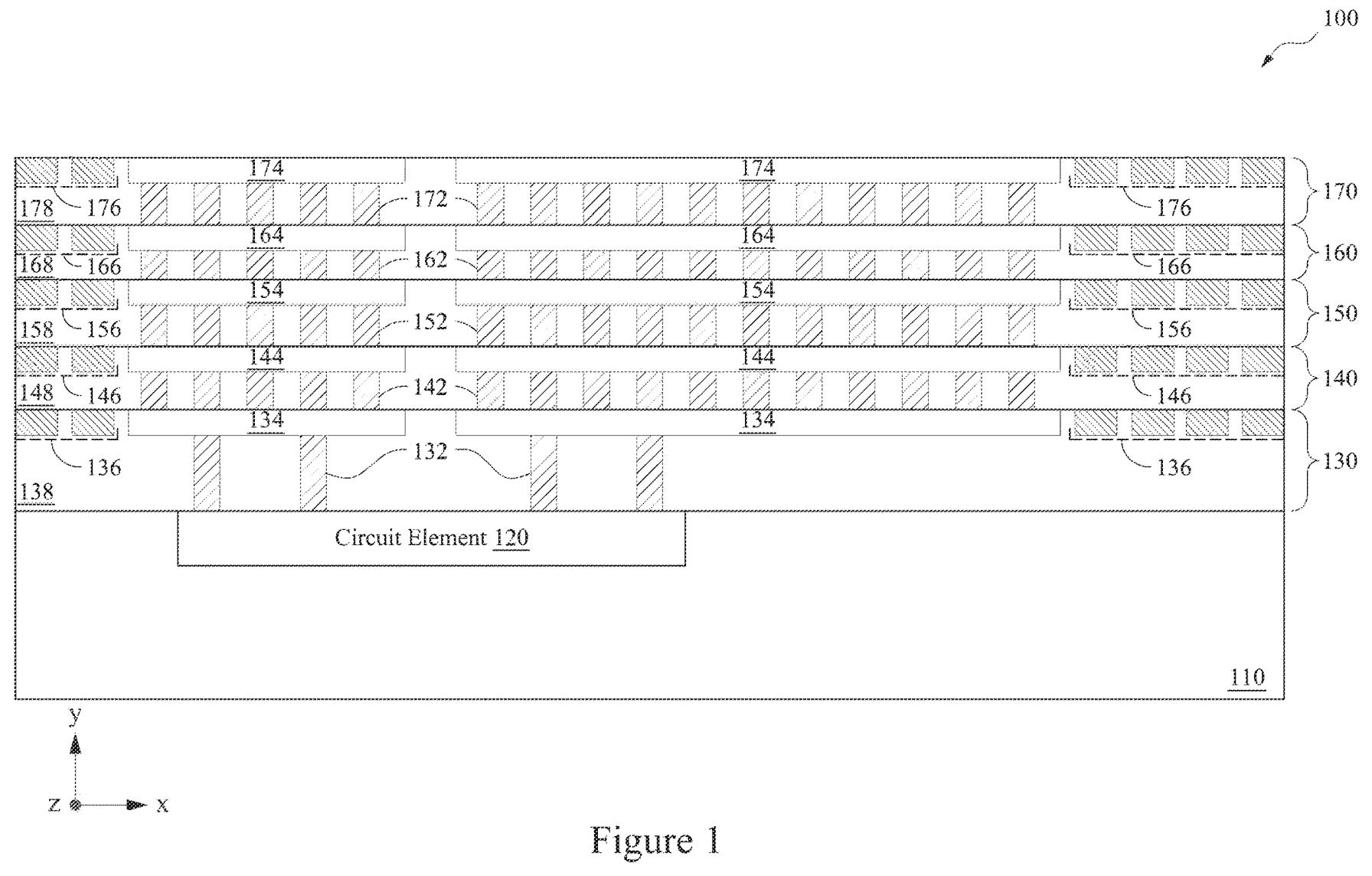

FIG. 1 is an illustration of a cross-sectional view of a semiconductor structure 100 with an interconnect structure having metal lines, dummy metal lines, and via structures, according to some embodiments. Semiconductor structure 100 includes a substrate 110, a circuit element 120, a first metallization layer 130, a second metallization layer 140, a third metallization layer 150, a fourth metallization layer 160, and a fifth metallization layer 170.

Substrate 110 can be a semiconductor material, such as silicon (Si), germanium (Ge), silicon germanium (SiGe), a silicon-on-insulator (SOI) structure, other suitable substrate materials, and combinations thereof. Further, substrate 110 can be doped with p-type dopants, such as boron (B), indium (In), aluminum (Al), and gallium (Ga), or n-type dopants, such as phosphorous (P) and arsenic (As).

Circuit element 120 is a semiconductor device formed on substrate 110. In some embodiments, circuit element 120 can be a transistor device, such as a GAAFET and a finFET. Circuit element 120 can also be an electronic component, such as a capacitor and a resistor. FIGS. 2A and 2B are illustrations of a transistor device and a capacitor structure, respectively, that can be implemented as circuit element 120, according to some embodiments.

FIG. 2A illustrates an isometric view of a transistor device 200 (also referred to herein as "field effect transistor (FET) 200") that can be implemented as circuit element 120, according to some embodiments. In some embodiments, FET 200 can be a GAAFET or a finFET. FET 200 can be an n-type FET or a p-type FET.

FET 200 can be formed on substrate 110 and can include gate structures 202 disposed on a fin structure 204 and source/drain (S/D) regions 206 disposed on portions of fin structure 204 that are not covered by gate structures 202. In some embodiments, fin structure 204 can include a material similar to substrate 110 and extend along an x-direction. In some embodiments, FET 200 can further include gate spacers 208, shallow trench isolation (STI) regions 210, etch stop layers (ESLs) 212A-212C, and inter-layer dielectric (ILD) layers 138, 214, and 216. In some embodiments, gate spacers 208, STI regions 210, ESLs 212A-212C, and ILD layers 138, 214, and 216 can include an insulating material, such as silicon oxide, silicon nitride (SiN), silicon carbon nitride (SiCN), silicon oxycarbon nitride (SiOCN), and silicon germanium oxide.

In some embodiments, FET 200 can be a GAAFET and can include (i) S/D regions 206, (ii) contact structures 218 disposed on front-side surface of S/D regions 206, (iii) via structures 132 disposed on contact structures 218, (iv) nanostructured channel regions (not shown in FIG. 2A) disposed on fin structure 204, and (v) gate structures 202 surrounding the nanostructured channel regions. As used herein, the term "nanostructured" defines a structure, layer, and/or region as having a horizontal dimension (e.g., along an x- and/or y-direction) and/or a vertical dimension (e.g., along a z-direction) less than about 100 nm (e.g., about 90 nm, about 50 nm, or about 10 nm; other values less than about 100 nm are within the scope of the disclosure).

In some embodiments, the nanostructured channel regions can include semiconductor materials similar to or different from substrate 110. In some embodiments, the nanostructured channel regions can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Gate portions of gate structures 202 surrounding the nanostructured channel regions can be electrically isolated from adjacent S/D regions 206 by inner spacers (not shown in FIG. 2A), which can include an insulating material, such as $SiO_x$, SiN, SiCN, SiOCN, and other suitable insulating materials.

In some embodiments, each of contact structures 218 can include (i) a silicide layer disposed within each of S/D regions 206 and (ii) a contact plug disposed on the silicide layer. In some embodiments, the silicide layer can include a metal silicide. In some embodiments, the contact plug can include a conductive material, such as cobalt (Co), tungsten (W), ruthenium (Ru), iridium (Ir), nickel (Ni), osmium (Os), rhodium (Rh), aluminum (Al), molybdenum (Mo), other suitable conductive materials, and a combination thereof. In some embodiments, via structures 132 can include conductive materials, such as Ru, Co, Ni, Al, Mo, W, Ir, Os, Cu, Pt, any other suitable conductive material, or combinations thereof. Contact structures 218 can electrically connect to an overlying metal line 134 through via structures 132. In some embodiments, metal line 134, via structures 132, ESL 212C, and ILD layer 138 are in first metallization layer 130. In some embodiments, each of via structures 132 can be electrically connected to different metal lines 134 electrically isolated from each other in first metallization layer 130.

FIG. 2B is an illustration of a cross-sectional view of a capacitor structure 250 that can be implemented as circuit element 120, according to some embodiments. In some embodiments, capacitor structure 250 is a deep trench capacitor (also referred to as "deep trench capacitor 250") that includes a first electrode 252, a dielectric layer 254, a second electrode 256, and a plug structure 258.

First electrode 252 and second electrode 256 form an electrode pair for deep trench capacitor 250 and are spaced apart by a thickness of dielectric layer 254, which provides electrical insulation between the two electrodes. First electrode 252 and second electrode 256 can include a semiconductor material (e.g., Si), a conductive material (e.g., gold, silver, copper, aluminum, tungsten, or alloys thereof), or any other suitable material. Dielectric layer 254 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium aluminum oxide (ZrAlO), zirconium silicate ($ZrSiO_2$), lanthanum oxide ($La_2O_3$), aluminum oxide ($Al_2O_3$) zinc oxide (ZnO), hafnium zinc oxide (HfZnO), and yttrium oxide ($Y_2O_3$), or other suitable materials.

Plug structure 258 fills a recess created by second electrode 256 and can have a high aspect ratio, according to some embodiments. The aspect ratio of plug structure 258 can be defined by a ratio of the recess height (e.g., in the y-direction) to the recess width (e.g., in the x-direction). The aspect ratio can be from about 20 to about 80. Plug structure 258 can include a semiconductor material (e.g., Si), a conductive material (e.g., gold, silver, copper, aluminum, tungsten, or alloys thereof), or any other suitable material. In some embodiments, plug structure 258 can be the same material as second electrode 256.

Lower portions of first electrode 252, dielectric layer 254, second electrode 256, and plug structure 258 are below a top surface of substrate 110. Upper portions of first electrode 252, dielectric layer 254, second electrode 256, and plug structure 258 are above the top surface of substrate 110 and within ILD layer 138 of first metallization layer 130, according to some embodiments. ILD layer 138 can include an insulating material, such as silicon oxide, SiN, SiCN, SiOCN, and silicon germanium oxide. Within first metallization layer 130, via structures 132 can make contact with first electrode 252 and second electrode 256 to connect these electrodes to overlying metal lines 134. In some embodiments, each of via structures 132 can be electrically connected to different metal lines 134 electrically isolated from each other in first metallization layer 130.

Though a transistor device and a capacitor structure are illustrated for circuit element 120 in FIGS. 2A and 2B, respectively, other types of semiconductor devices and other number of semiconductor devices can be implemented in semiconductor structure 100. These other types and number of semiconductor devices are within the scope of the present disclosure.

Referring to FIG. 1, first metallization layer 130, second metallization layer 140, third metallization layer 150, fourth metallization layer 160, and fifth metallization layer 170 form the interconnect structure of semiconductor structure 100, according to some embodiments. These metallization layers electrically connect circuit element 120 to other circuit elements in semiconductor structure 100 (not shown in FIG. 1).

Each of the metallization layers in semiconductor structure 100 includes metal lines, dummy metal lines, and via structures, in which these interconnect structures are disposed in an ILD layer. For example, first metallization layer 130 includes metal lines 134, dummy metal lines 136, and via structures 132 disposed in an ILD layer 138. Second metallization layer 140 includes metal lines 144, dummy metal lines 146, and via structures 142 disposed in an ILD layer 148. Third metallization layer 150 includes metal lines 154, dummy metal lines 156, and via structures 152 disposed in an ILD layer 158. Fourth metallization layer 160 includes metal lines 164, dummy metal lines 166, and via structures 162 disposed in an ILD layer 168. Fifth metallization layer 170 includes metal lines 174, dummy metal lines 176, and via structures 172 disposed in an ILD layer 178. In some embodiments, the metal lines, dummy metal lines, and via structures in first metallization layer 130, second metallization layer 140, third metallization layer 150, fourth metallization layer 160, and fifth metallization layer 170 can include conductive materials, such as Ru, Co, Ni, Al, Mo, W, Ir, Os, Cu, Pt, any other suitable conductive material, or combinations thereof. As discussed above, in some embodiments, ILD layer 138 can include an insulating material, such as silicon oxide, SiN, SiCN, SiOCN, and silicon germanium oxide.

Based on the description herein, more than one circuit element 120 can be formed in substrate 110, in which the one or more circuit elements 120 can be electrically connected to the interconnect structure of semiconductor structure 100—e.g., first metallization layer 130, second metallization layer 140, third metallization layer 150, fourth metallization layer 160, and fifth metallization layer 170—through one or more via structures 132. Also, more or less than five metallization layers can be implemented in semiconductor structure 100 to electrically connect to circuit element 120, to other circuit elements within semiconductor structure 100, and/or to one or more reference supply voltages (e.g., ground or power supply). For example purposes, the embodiments herein are described using the interconnect structure of semiconductor structure 100.

In the following description, FIGS. 3A, 3B, 4A, 4B, 5A, 5B, 6A, 6B, 7A, 7B, 8A, 8B, 9A, 9B, 11A, and 11B illustrate top-level views of interconnect structures for semiconductor structure 100, according to some embodiments. In some embodiments, FIGS. 3A, 4A, 5A, 6A, 7A, 8A, 9A, and 11A illustrate top-level views of interconnect structures for odd-numbered metallization layers, such as first metallization layer 130, third metallization layer 150, and fifth metallization layer 170 of FIG. 1. In some embodiments, FIGS. 3B, 4B, 5B, 6B, 7B, 8B, 9B, and 11B illustrate top-level views of interconnect structures for even-numbered metallization layers, such as second metallization layer 140 and fourth metallization layer 160 of FIG. 1. Based on the description herein, the interconnect structures illustrated in FIGS. 3A, 4A, 5A, 6A, 7A, 8A, 9A, and 11A can be implemented in even-numbered metallization layers, and the interconnect structures illustrated in FIGS. 3B, 4B, 5B, 6B, 7B, 8B, 9B, and 11B can be implemented in odd-numbered metallization layers. With the alternating interconnect structures between odd- and even-numbered metallization layers and the directional arrangement of dummy metal lines in each of the metallization layers, tensile stress and stretching forces can be reduced in the BEOL manufacturing process of semiconductor structure 100, thus reducing wafer warpage.

Figure 3B:
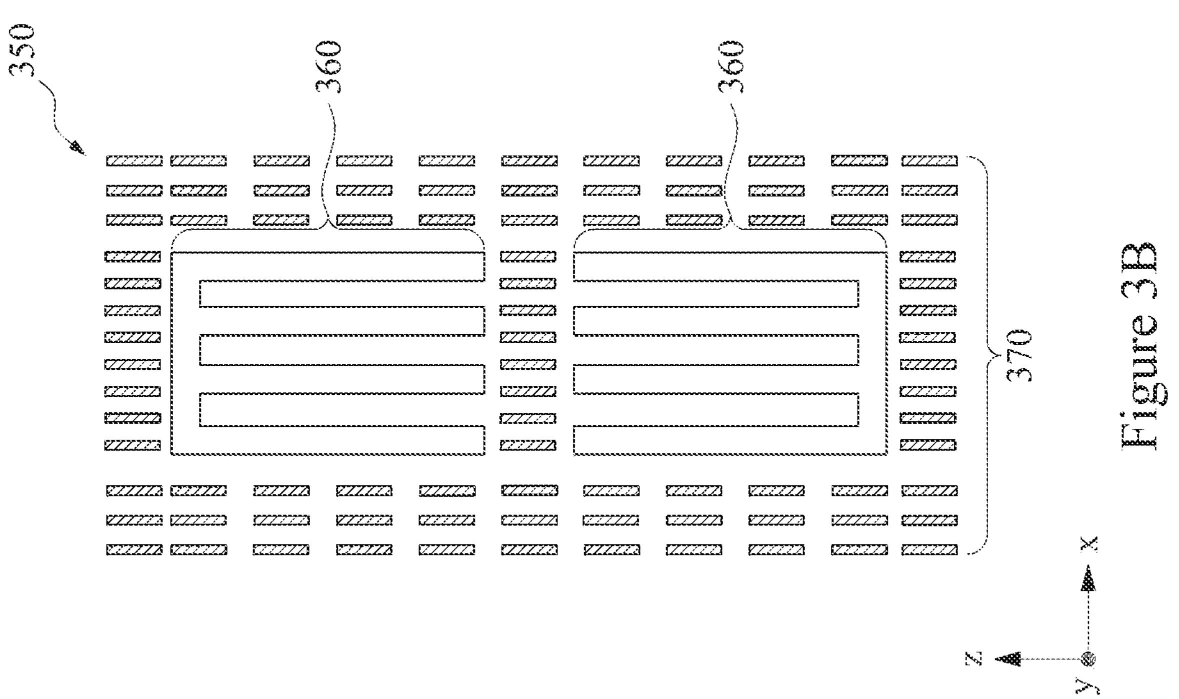
FIGS. 3A and 3B are illustrations of top-level views of first patterns for interconnect structures for a semiconductor structure, according to some embodiments.
Figure 3A:
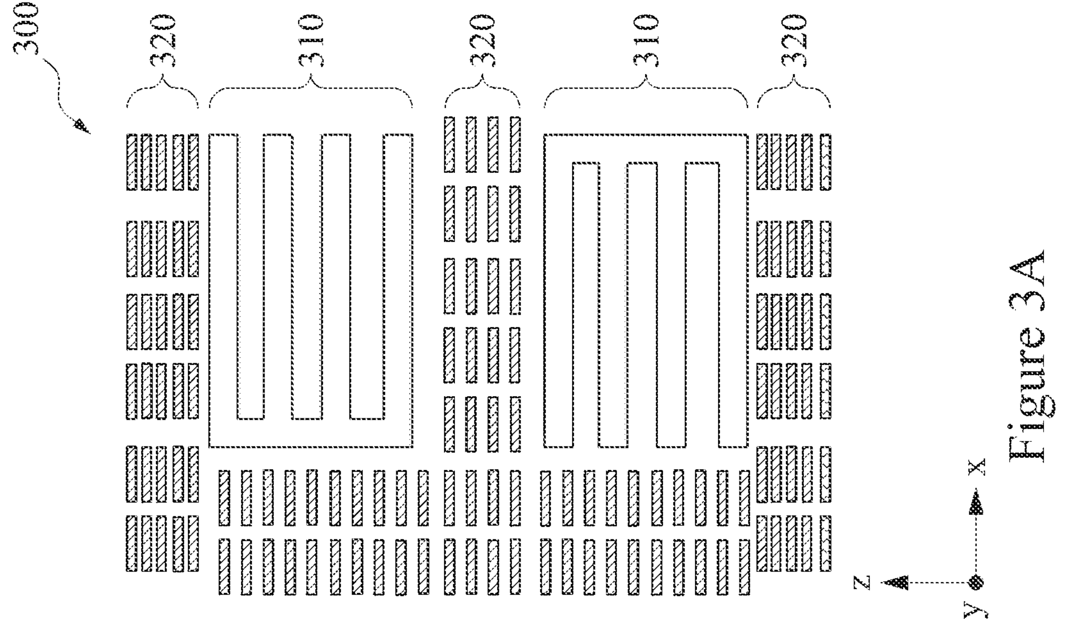

FIG. 3A and FIG. 3B are illustrations of top-level views of first patterns for interconnect structure 300 and interconnect structure 350, respectively, for semiconductor structure 100 according to some embodiments. In some embodiments, interconnect structure 300 can be implemented in the odd-numbered metallization layers of semiconductor structure 100 (e.g., first metallization layer 130, third metallization layer 150, and fifth metallization layer 170) and interconnect structure 350 can be implemented in the even-numbered metallization layers of semiconductor structure 100 (e.g., second metallization layer 140 and fourth metallization layer 160)—or vice versa.

Referring to FIG. 3A, interconnect structure 300 includes metal lines 310 and dummy metal lines 320. In some embodiments, metal lines 310 can represent metal lines 134, 154, and 174 and dummy metal lines 320 can represent dummy metal lines 136, 156, and 176 of semiconductor structure 100. Metal lines 310 can have elongated sides in a first direction, such as an x-direction. In some embodiments, dummy metal lines 320 are disposed adjacent to metal lines 310 and have a rectangular shape with an elongated side that extends in the same direction as the elongated sides of metal lines 310—e.g., extends in the first direction, such as the x-direction. In some embodiments, if metal lines 310 have elongated sides in different directions (e.g., elongated sides in the x- and z-directions), then dummy metal lines 320 can have a rectangular shape with an elongated side in the same direction as a majority of elongated sides of metal lines 310.

Referring to FIG. 3B, interconnect structure 350 includes metal lines 360 and dummy metal lines 370. In some embodiments, metal lines 360 can represent metal lines 144 and 164 and dummy metal lines 370 can represent dummy metal lines 146 and 166 of semiconductor structure 100. Metal lines 360 can have elongated sides in a second direction perpendicular to the first direction, such as a z-direction. In some embodiments, dummy metal lines 370 are disposed adjacent to metal lines 360 and have a rectangular shape with an elongated side that extends in the same direction as the elongated sides of metal lines 360—e.g., extends in the second direction, such as the z-direction. In some embodiments, if metal lines 360 have elongated sides in different directions (e.g., elongated sides in the x- and z-directions), then dummy metal lines 370 can have a rectangular shape with an elongated side in the same direction as a majority of elongated sides of metal lines 360.

Referring to FIGS. 3A and 3B, each of dummy metal lines 320 and 370 can have substantially the same or different dimensions, according to some embodiments. The shape of dummy metal lines 320 and 370 can be shapes other than rectangles, such as a square. In some embodiments, an elongated side dimension of dummy metal lines 320 and 370 can be between about 0.2 μm and about 10 μm. An elongated side dimension of metal lines 310 and 360 can be between about 0.2 μm and about 10 μm. A ratio of an elongated side dimension of dummy metal line 320/370 to an elongated side dimension of metal line 310/360 can be about 0.02 to about 1, according to some embodiments.

Figure 4B:
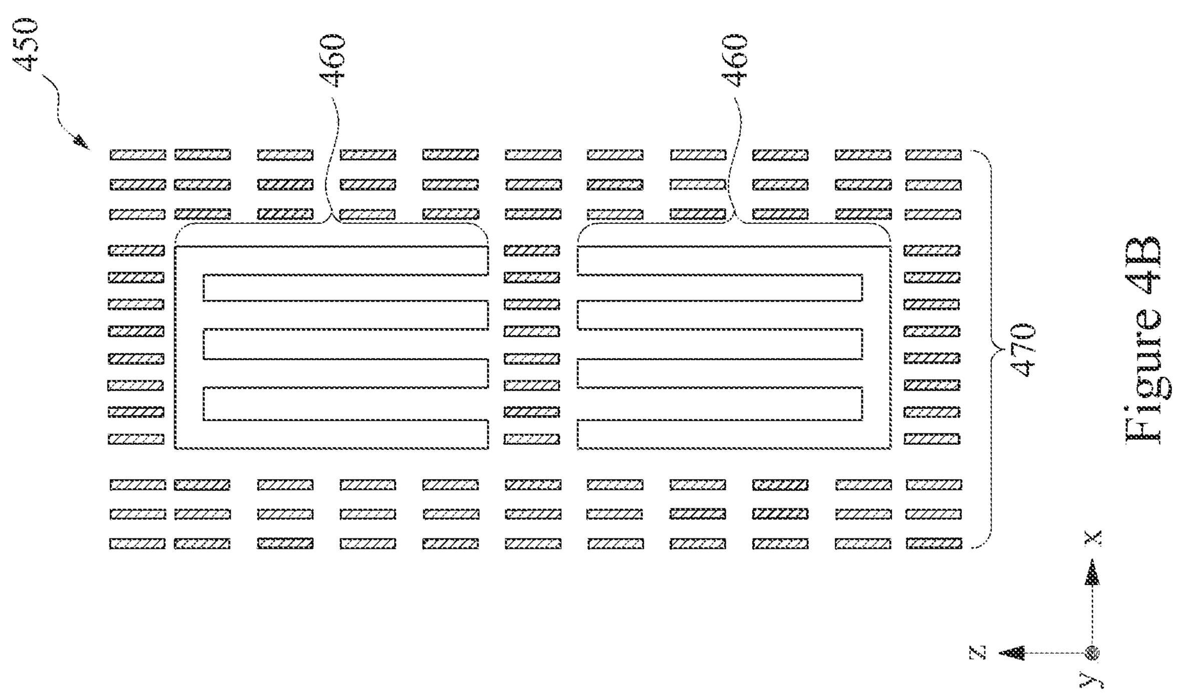
FIGS. 4A and 4B are illustrations of top-level views of second patterns for interconnect structures for a semiconductor structure, according to some embodiments.
Figure 4A:
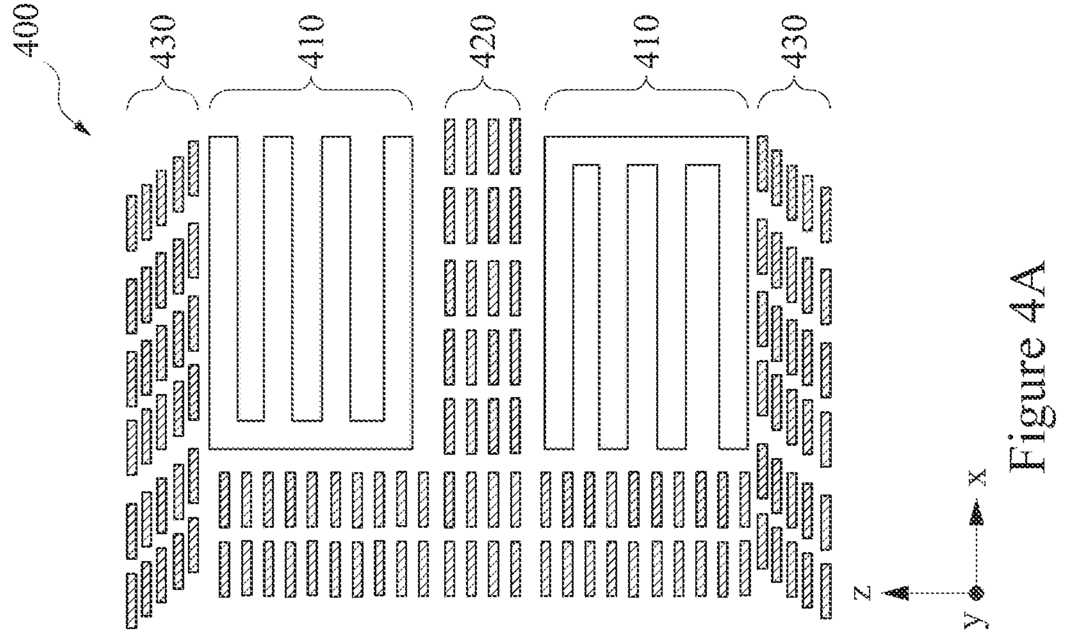

FIG. 4A and FIG. 4B are illustrations of top-level views of second patterns for interconnect structure 400 and interconnect structure 450, respectively, for semiconductor structure 100 according to some embodiments. In some embodiments, interconnect structure 400 can be implemented in the odd-numbered metallization layers of semiconductor structure 100 (e.g., first metallization layer 130, third metallization layer 150, and fifth metallization layer 170) and interconnect structure 450 can be implemented in the even-numbered metallization layers of semiconductor structure 100 (e.g., second metallization layer 140 and fourth metallization layer 160)—or vice versa.

Referring to FIG. 4A, interconnect structure 400 includes metal lines 410 and dummy metal lines 420 and 430. In some embodiments, metal lines 410 can represent metal lines 134, 154, and 174 and dummy metal lines 420 and 430 can represent dummy metal lines 136, 156, and 176 of semiconductor structure 100. Metal lines 410 can have elongated sides in a first direction, such as an x-direction. In some embodiments, dummy metal lines 420 and 430 are disposed adjacent to metal lines 410 and have a rectangular shape with an elongated side that extends in the same direction as the elongated sides of metal lines 410—e.g., extends in the first direction, such as the x-direction. In some embodiments, if metal lines 410 have elongated sides in different directions (e.g., elongated sides in the x- and z-directions), then dummy metal lines 420 and 430 can have a rectangular shape with an elongated side in the same direction as a majority of elongated sides of metal lines 410. In some embodiments, one or more rows of dummy metal lines in dummy metal lines 430 are offset in the first direction (e.g., the x-direction) relative to one another. In some embodiments, the offset in the first direction is less than a length of dummy metal lines 430.

Referring to FIG. 4B, interconnect structure 450 includes metal lines 460 and dummy metal lines 470. In some embodiments, metal lines 460 can represent metal lines 144 and 164 and dummy metal lines 470 can represent dummy metal lines 146 and 166 of semiconductor structure 100. Metal lines 460 can have elongated sides in a second direction perpendicular to the first direction, such as a z-direction. In some embodiments, dummy metal lines 470 are disposed adjacent to metal lines 460 and have a rectangular shape with an elongated side that extends in the same direction as the elongated sides of metal lines 460—e.g., extends in the second direction, such as the z-direction. In some embodiments, if metal lines 460 have elongated sides in different directions (e.g., elongated sides in the x- and z-directions), then dummy metal lines 470 can have a rectangular shape with an elongated side in the same direction as a majority of elongated sides of metal lines 460.

Referring to FIGS. 4A and 4B, each of dummy metal lines 420, 430, and 470 can have substantially the same or different dimensions, according to some embodiments. The shape of dummy metal lines 420, 430, and 470 can be shapes other than rectangles, such as a square. In some embodiments, an elongated side dimension of dummy metal lines 420, 430, and 470 can be between about 0.2 μm and about 10 μm. An elongated side dimension of metal lines 410 and 460 can be between about 0.2 μm and about 10 μm. A ratio of an elongated side dimension of dummy metal line 420/430/470 to an elongated side dimension of metal line 410/460 can be about 0.02 to about 1, according to some embodiments.

Figures 5A, 5B:
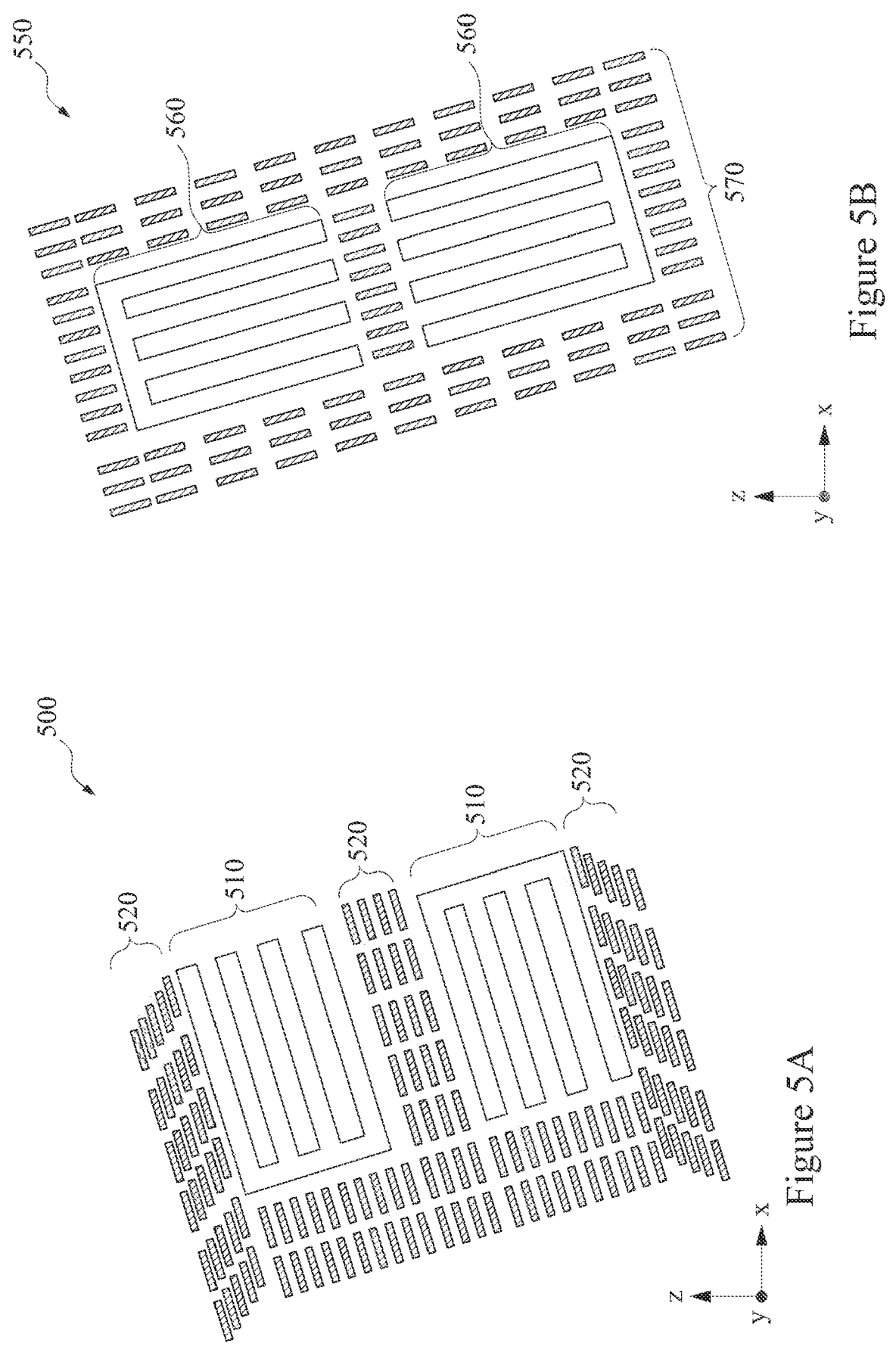

FIG. 5A and FIG. 5B are illustrations of top-level views of third patterns for interconnect structure 500 and interconnect structure 550, respectively, for semiconductor structure 100 according to some embodiments. In some embodiments, interconnect structure 500 can be implemented in the odd-numbered metallization layers of semiconductor structure 100 (e.g., first metallization layer 130, third metallization layer 150, and fifth metallization layer 170) and interconnect structure 550 can be implemented in the even-numbered metallization layers of semiconductor structure 100 (e.g., second metallization layer 140 and fourth metallization layer 160)—or vice versa.

Referring to FIG. 5A, interconnect structure 500 includes metal lines 510 and dummy metal lines 520. In some embodiments, metal lines 510 can represent metal lines 134, 154, and 174 and dummy metal lines 520 can represent dummy metal lines 136, 156, and 176 of semiconductor structure 100. Metal lines 510 can have elongated sides in a first direction, such as in an angled direction relative to an x-axis. The angled direction relative to the x-axis can be a non-zero angle between about 0 degrees and about 90 degrees, according to some embodiments. In some embodiments, dummy metal lines 520 are disposed adjacent to metal lines 510 and have a rectangular shape with an elongated side that extends in the same direction as the elongated sides of metal lines 510—e.g., extends in the first direction, such as in the angled direction relative to the x-axis. In some embodiments, if metal lines 510 have elongated sides in different directions (e.g., elongated sides at different angles relative to the x-axis), then dummy metal lines 520 can have a rectangular shape with an elongated side in the same direction as the angled direction of a majority of elongated sides of metal lines 510.

Referring to FIG. 5B, interconnect structure 550 includes metal lines 560 and dummy metal lines 570. In some embodiments, metal lines 560 can represent metal lines 144 and 164 and dummy metal lines 570 can represent dummy metal lines 146 and 166 of semiconductor structure 100. Metal lines 560 can have elongated sides in a second direction perpendicular to the first direction. In some embodiments, dummy metal lines 570 are disposed adjacent to metal lines 560 and have a rectangular shape with an elongated side that extends in the same direction as the elongated sides of metal lines 560—e.g., extends in the second direction perpendicular to the first direction. In some embodiments, if metal lines 560 have elongated sides in different directions (e.g., elongated sides at different angles relative to the x-axis), then dummy metal lines 570 can have a rectangular shape with an elongated side in the same direction as a majority of elongated sides of metal lines 560.

Referring to FIGS. 5A and 5B, each of dummy metal lines 520 and 570 can have substantially the same or different dimensions, according to some embodiments. The shape of dummy metal lines 520 and 570 can be shapes other than rectangles, such as a square. In some embodiments, an elongated side dimension of dummy metal lines 520 and 570 can be between about 0.2 μm and about 10 μm. An elongated side dimension of metal lines 510 and 560 can be between about 0.2 μm and about 10 μm. A ratio of an elongated side dimension of dummy metal line 520/570 to an elongated side dimension of metal line 510/560 can be about 0.02 to about 1, according to some embodiments.

Figure 6B:
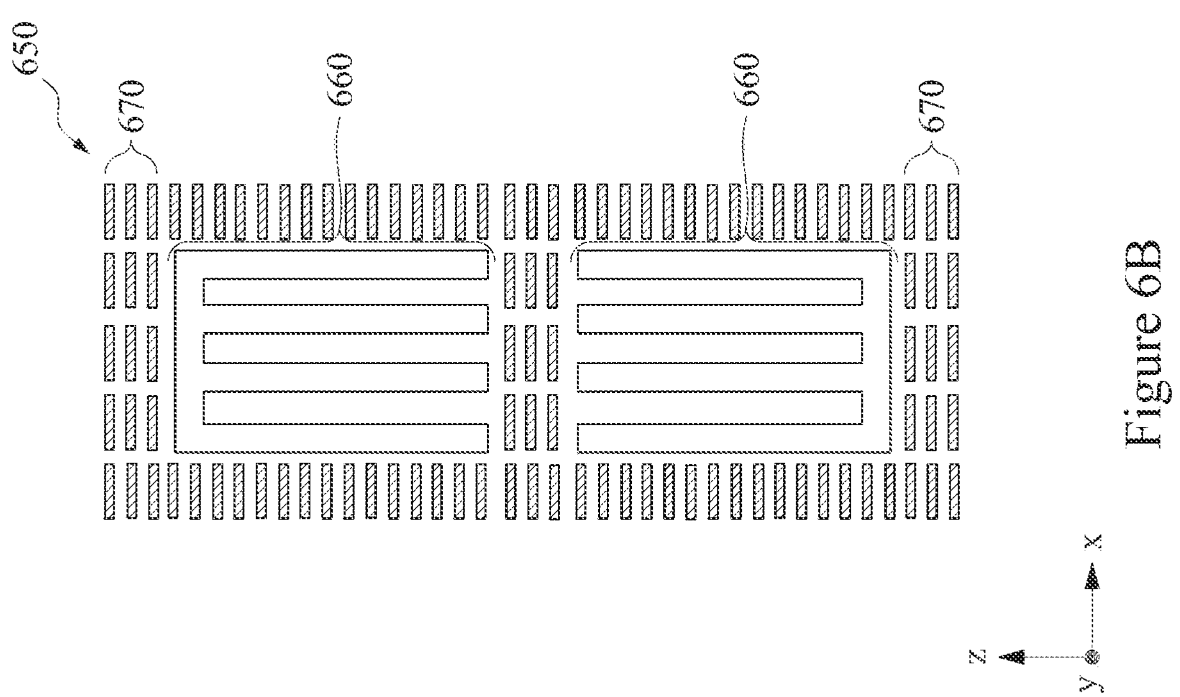
FIGS. 6A and 6B are illustrations of top-level views of fourth patterns for interconnect structures for a semiconductor structure, according to some embodiments.
Figure 6A:
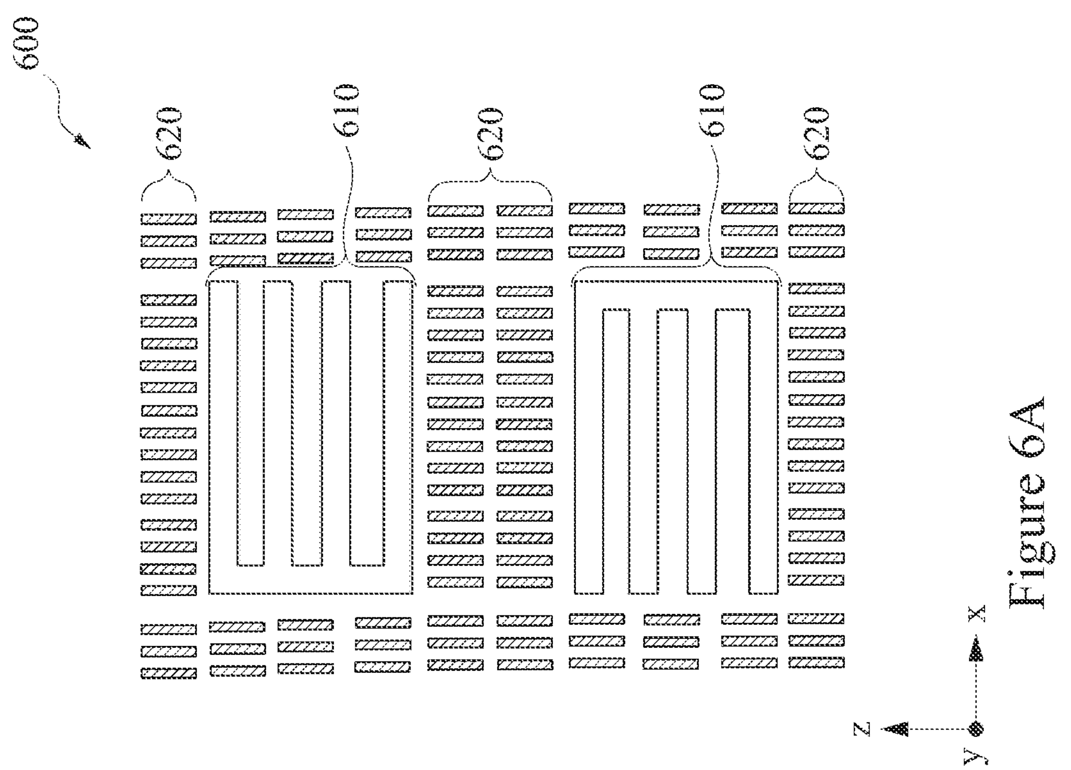

FIG. 6A and FIG. 6B are illustrations of top-level views of fourth patterns for interconnect structure 600 and interconnect structure 650, respectively, for semiconductor structure 100 according to some embodiments. In some embodiments, interconnect structure 600 can be implemented in the odd-numbered metallization layers of semiconductor structure 100 (e.g., first metallization layer 130, third metallization layer 150, and fifth metallization layer 170) and interconnect structure 650 can be implemented in the even-numbered metallization layers of semiconductor structure 100 (e.g., second metallization layer 140 and fourth metallization layer 160)—or vice versa.

Referring to FIG. 6A, interconnect structure 600 includes metal lines 610 and dummy metal lines 620. In some embodiments, metal lines 610 can represent metal lines 134, 154, and 174 and dummy metal lines 620 can represent dummy metal lines 136, 156, and 176 of semiconductor structure 100. Metal lines 610 can have elongated sides in a first direction, such as an x-direction. In some embodiments, dummy metal lines 620 are disposed adjacent to metal lines 610 and have a rectangular shape with an elongated side that extends in a second direction perpendicular to the elongated sides of metal lines 610—e.g., extends in a z-direction. In some embodiments, if metal lines 610 have elongated sides in different directions (e.g., elongated sides in the x- and z-directions), then dummy metal lines 620 can have a rectangular shape with an elongated side perpendicular to a majority of elongated sides of metal lines 610.

Referring to FIG. 6B, interconnect structure 650 includes metal lines 660 and dummy metal lines 670. In some embodiments, metal lines 660 can represent metal lines 144 and 164 and dummy metal lines 670 can represent dummy metal lines 146 and 166 of semiconductor structure 100. Metal lines 660 can have elongated sides in the second direction, such as the z-direction. In some embodiments, dummy metal lines 670 are disposed adjacent to metal lines 660 and have a rectangular shape with an elongated side that extends perpendicular to the elongated sides of metal lines 660—e.g., extends in the x-direction. In some embodiments, if metal lines 660 have elongated sides in different directions (e.g., elongated sides in the x- and z-directions), then dummy metal lines 670 can have a rectangular shape with an elongated side perpendicular to a majority of elongated sides of metal lines 660.

Referring to FIGS. 6A and 6B, each of dummy metal lines 620 and 670 can have substantially the same or different dimensions, according to some embodiments. The shape of dummy metal lines 620 and 670 can be shapes other than rectangles, such as a square. In some embodiments, an elongated side dimension of dummy metal lines 620 and 670 can be between about 0.2 μm and about 10 μm. An elongated side dimension of metal lines 610 and 660 can be between about 0.2 μm and about 10 μm. A ratio of an elongated side dimension of dummy metal line 620/670 to an elongated side dimension of metal line 610/660 can be about 0.02 to about 1, according to some embodiments.

Figure 7B:
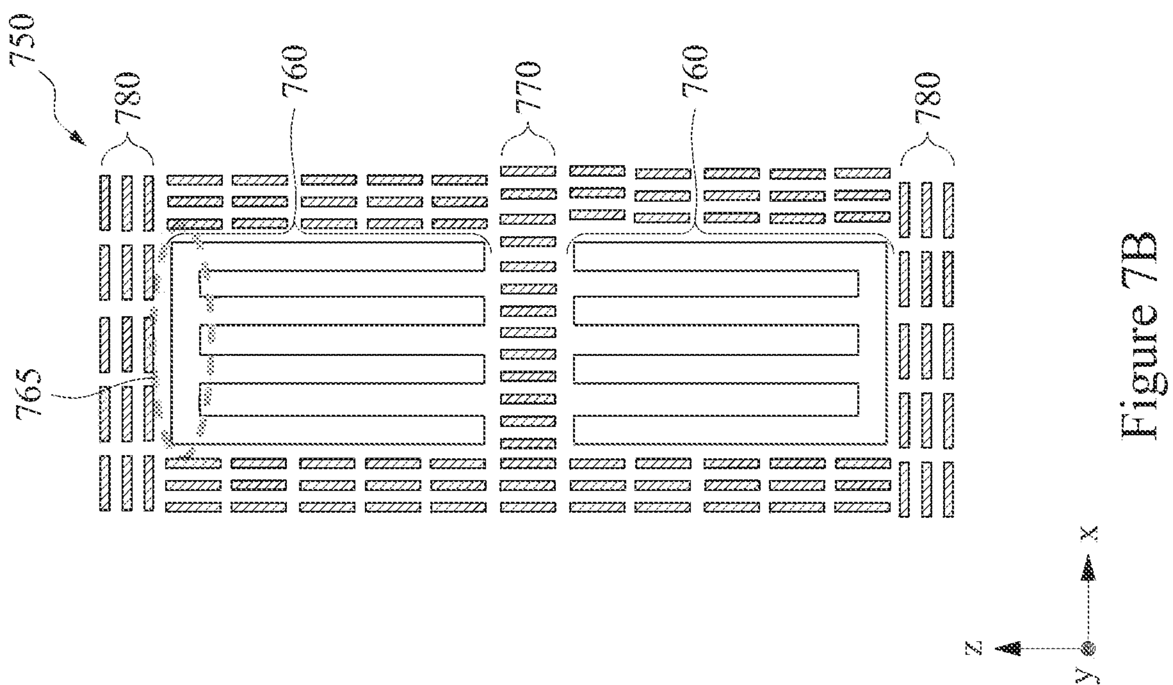
FIGS. 7A and 7B are illustrations of top-level views of fifth patterns for interconnect structures for a semiconductor structure, according to some embodiments.
Figure 7A:
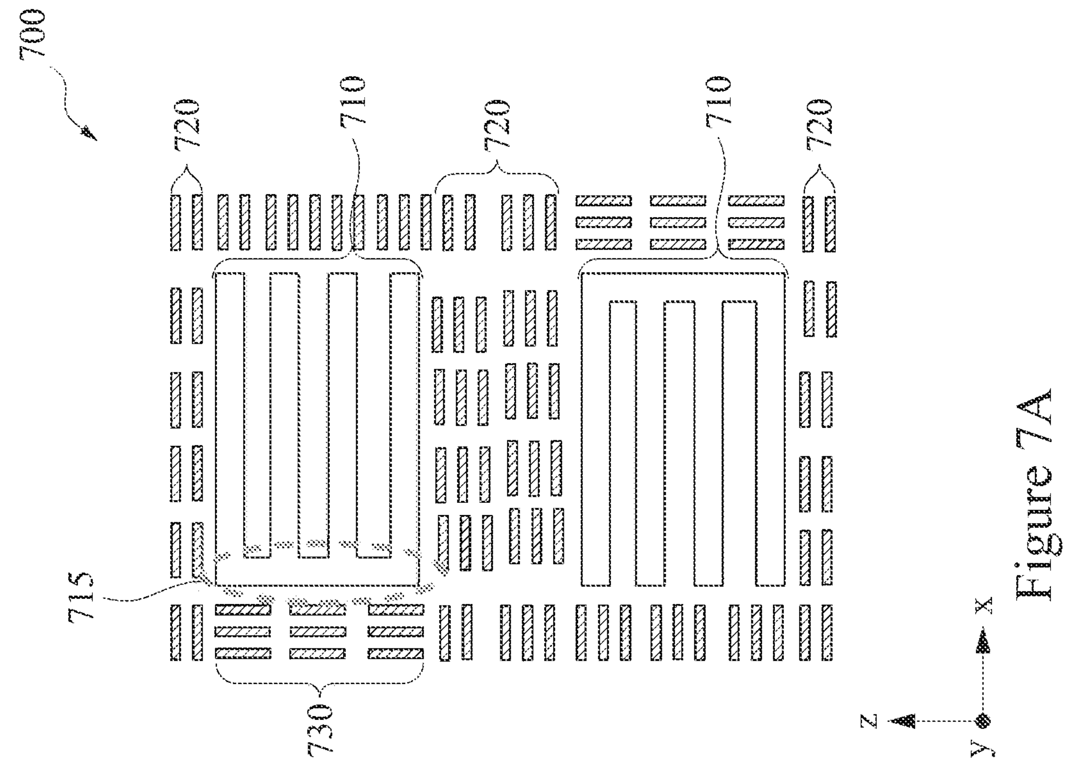

FIG. 7A and FIG. 7B are illustrations of top-level views of fifth patterns for interconnect structure 700 and interconnect structure 750, respectively, for semiconductor structure 100 according to some embodiments. In some embodiments, interconnect structure 700 can be implemented in the odd-numbered metallization layers of semiconductor structure 100 (e.g., first metallization layer 130, third metallization layer 150, and fifth metallization layer 170) and interconnect structure 750 can be implemented in the even-numbered metallization layers of semiconductor structure 100 (e.g., second metallization layer 140 and fourth metallization layer 160)—or vice versa.

Referring to FIG. 7A, interconnect structure 700 includes metal lines 710 and dummy metal lines 720 and 730. In some embodiments, metal lines 710 can represent metal lines 134, 154, and 174 and dummy metal lines 720 and 730 can represent dummy metal lines 136, 156, and 176 of semiconductor structure 100. Metal lines 710 can have elongated sides in a first direction, such as an x-direction. In some embodiments, dummy metal lines 720 are disposed adjacent to metal lines 710 and have a rectangular shape with an elongated side that extends in the same direction as the elongated sides of metal lines 710—e.g., extends in the x-direction. In some embodiments, if metal lines 710 have elongated sides in different directions (e.g., elongated sides in the x- and z-directions), then dummy metal lines 720 can have a rectangular shape with an elongated side in the same direction as a majority of elongated sides of metal lines 710.

In some embodiments, dummy metal lines 730 are disposed adjacent to metal lines 710 and have a rectangular shape with an elongated side that extends in a direction perpendicular to the elongated sides of metal lines 710—e.g., extends in a z-direction. For example, if a minority of segments of metal lines 710 extend in the z-direction—such as a metal line segment 715—dummy metal lines 730 can be disposed adjacent (or directly next to) an elongated side of the minority of segments of metal lines 710. In some embodiments, if metal lines 710 have elongated sides in different directions (e.g., elongated sides in the x- and z-directions), then dummy metal lines 730 can have a rectangular shape with an elongated side perpendicular to a majority of elongated sides of metal lines 710.

Referring to FIG. 7B, interconnect structure 750 includes metal lines 760 and dummy metal lines 770 and 780. In some embodiments, metal lines 760 can represent metal lines 144 and 164 and dummy metal lines 770 and 780 can represent dummy metal lines 146 and 166 of semiconductor structure 100. Metal lines 760 can have elongated sides in the second direction, such as the z-direction. In some embodiments, dummy metal lines 770 are disposed adjacent to metal lines 760 and have a rectangular shape with an elongated side that extends in the same direction as the elongated sides of metal lines 760—e.g., extends in the z-direction. In some embodiments, if metal lines 760 have elongated sides in different directions (e.g., elongated sides in the x- and z-directions), then dummy metal lines 770 can have a rectangular shape with an elongated side in the same direction as a majority of elongated sides of metal lines 760.

In some embodiments, dummy metal lines 780 are disposed adjacent to metal lines 760 and have a rectangular shape with an elongated side that extends in a direction perpendicular to the elongated sides of metal lines 760—e.g., extends in the z-direction. For example, if a minority of segments of metal lines 760 extend in the x-direction—such as a metal line segment 765—dummy metal lines 780 can be disposed adjacent (or directly next to) an elongated side of the minority of segments of metal lines 760. In some embodiments, if metal lines 760 have elongated sides in different directions (e.g., elongated sides in the x- and z-directions), then dummy metal lines 780 can have a rectangular shape with an elongated side perpendicular to a majority of elongated sides of metal lines 760.

Referring to FIGS. 7A and 7B, each of dummy metal lines 720, 730, 770, and 780 can have substantially the same or different dimensions, according to some embodiments. The shape of dummy metal lines 720, 730, 770, and 780 can be shapes other than rectangles, such as a square. In some embodiments, dummy metal lines 730 and dummy metal lines 780 can be between about 1 percent and about 20 percent of the total number of dummy metal lines on each of their respective metallization layers. Put differently, dummy metal lines 720 and dummy metal lines 770 can be between about 80 percent and about 99 percent of the total dummy metal lines on each of their respective metallization layers.

In some embodiments, an elongated side dimension of dummy metal lines 720, 730, 770, and 780 can be between about 0.2 μm and about 10 μm. An elongated side dimension of metal lines 710 and 760 can be between about 0.2 μm and about 10 μm. A ratio of an elongated side dimension of dummy metal line 720/730/770/780 to an elongated side dimension of metal line 710/760 can be about 0.02 to about 1, according to some embodiments.

Figure 8B:
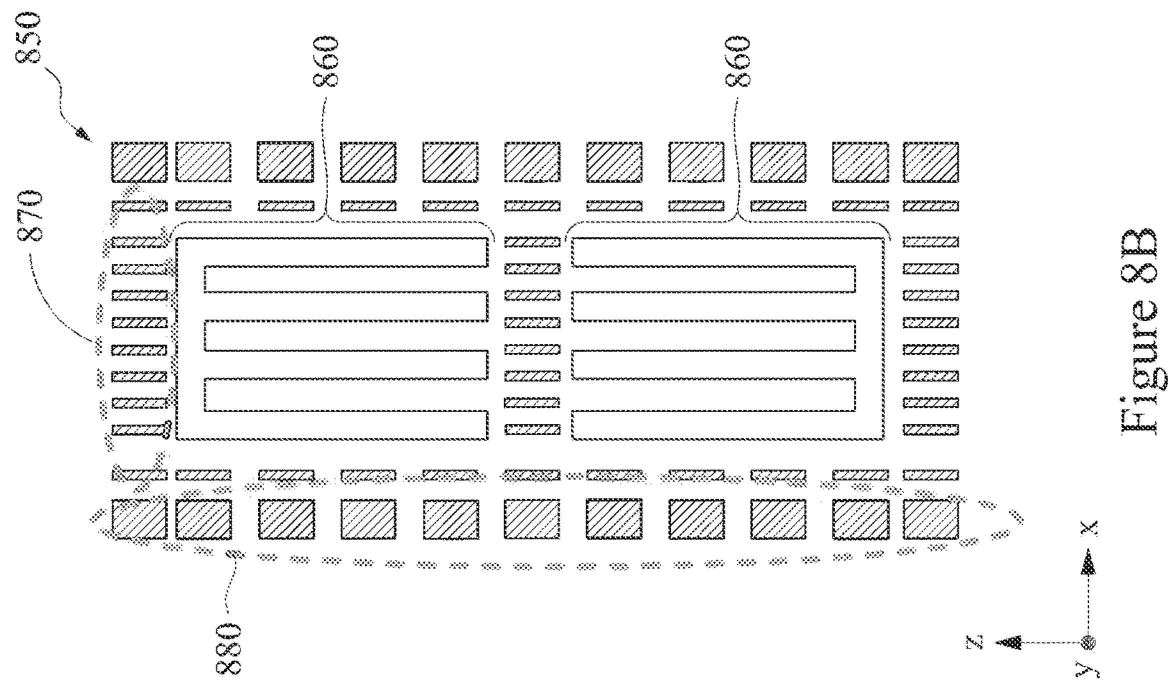
FIGS. 8A and 8B are illustrations of top-level views of sixth patterns for interconnect structures for a semiconductor structure, according to some embodiments.
Figure 8A:
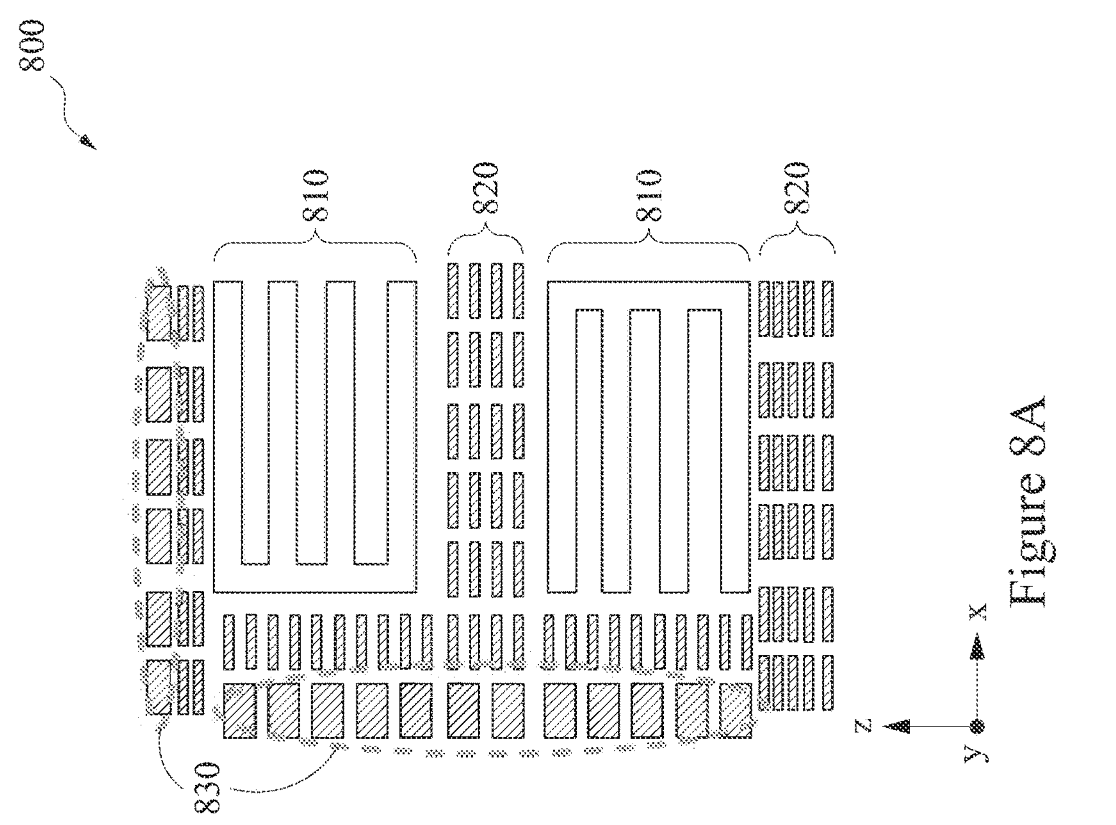

FIG. 8A and FIG. 8B are illustrations of top-level views of sixth patterns for interconnect structure 800 and interconnect structure 850, respectively, for semiconductor structure 100 according to some embodiments. In some embodiments, interconnect structure 800 can be implemented in the odd-numbered metallization layers of semiconductor structure 100 (e.g., first metallization layer 130, third metallization layer 150, and fifth metallization layer 170) and interconnect structure 850 can be implemented in the even-numbered metallization layers of semiconductor structure 100 (e.g., second metallization layer 140 and fourth metallization layer 160)—or vice versa.

Referring to FIG. 8A, interconnect structure 800 includes metal lines 810 and dummy metal lines 820 and 830. In some embodiments, metal lines 810 can represent metal lines 134, 154, and 174 and dummy metal lines 820 and 830 can represent dummy metal lines 136, 156, and 176 of semiconductor structure 100. Metal lines 810 can have elongated sides in a first direction, such as an x-direction. In some embodiments, dummy metal lines 820 and 830 are disposed adjacent to metal lines 810 and have a rectangular shape with an elongated side that extends in the same direction as the elongated sides of metal lines 310—e.g., extends in the first direction, such as the x-direction. In some embodiments, if metal lines 810 have elongated sides in different directions (e.g., elongated sides in the x- and z-directions), then dummy metal lines 820 and 830 can have a rectangular shape with an elongated side in the same direction as a majority of elongated sides of metal lines 810.

Referring to FIG. 8B, interconnect structure 850 includes metal lines 860 and dummy metal lines 870 and 880. In some embodiments, metal lines 860 can represent metal lines 144 and 164 and dummy metal lines 870 and 880 can represent dummy metal lines 146 and 166 of semiconductor structure 100. Metal lines 860 can have elongated sides in a second direction perpendicular to the first direction, such as a z-direction. In some embodiments, dummy metal lines 870 and 880 are disposed adjacent to metal lines 860 and have a rectangular shape with an elongated side that extends in the same direction as the elongated sides of metal lines 860—e.g., extends in the second direction, such as the z-direction. In some embodiments, if metal lines 860 have elongated sides in different directions (e.g., elongated sides in the x- and z-directions), then dummy metal lines 870 and 880 can have a rectangular shape with an elongated side in the same direction as a majority of elongated sides of metal lines 860.

Referring to FIGS. 8A and 8B, each of dummy metal lines 820, 830, 870, and 880 can have substantially the same or different dimensions, according to some embodiments. The shape of dummy metal lines 820, 830, 870, and 880 can be shapes other than rectangles, such as a square. In some embodiments, an elongated side dimension of dummy metal lines 820, 830, 870, and 880 can be between about 0.2 μm and about 10 μm. An elongated side dimension of metal lines 810 and 860 can be between about 0.2 μm and about 10 μm. A ratio of an elongated side dimension of dummy metal line 820/830/870/880 to an elongated side dimension of metal line 810/860 can be about 0.02 to about 1, according to some embodiments.

In some embodiments, the widths of dummy metal lines 820, 830, 870, and 880 can vary based on a proximity of the dummy metal lines from metal lines 810 and 860. For example, dummy metal lines closer to metal line 810 (e.g., dummy metal lines 820) can have a width less than that of dummy metal lines farther from metal line 810 (e.g., dummy metal lines 830). Similarly, dummy metal lines closer to metal line 860 (e.g., dummy metal lines 870) can have a width less than that of dummy metal lines farther from metal line 860 (e.g., dummy metal lines 880). The widest width of dummy metal lines 820 and 830 can be less than a width of metal line 810, and the widest width of dummy metal lines 870 and 880 can be less than a width of metal line 860, according to some embodiments.

Figure 9B:
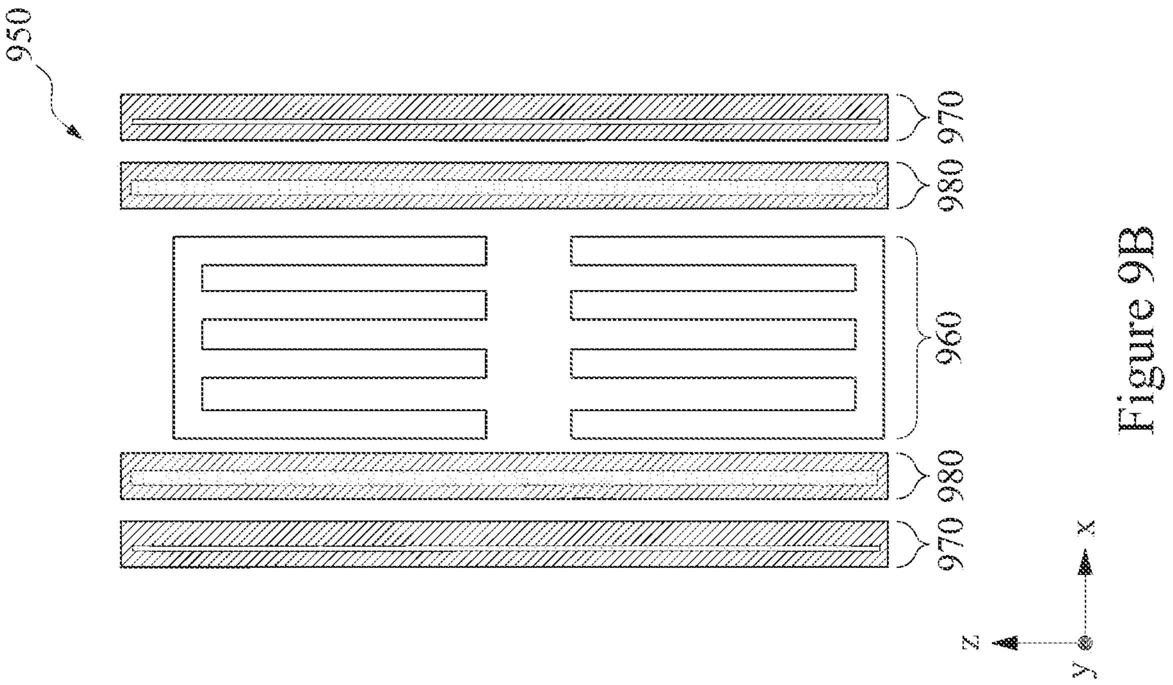
FIGS. 9A and 9B are illustrations of top-level views of seventh patterns for interconnect structures for a semiconductor structure, according to some embodiments.
Figure 9A:
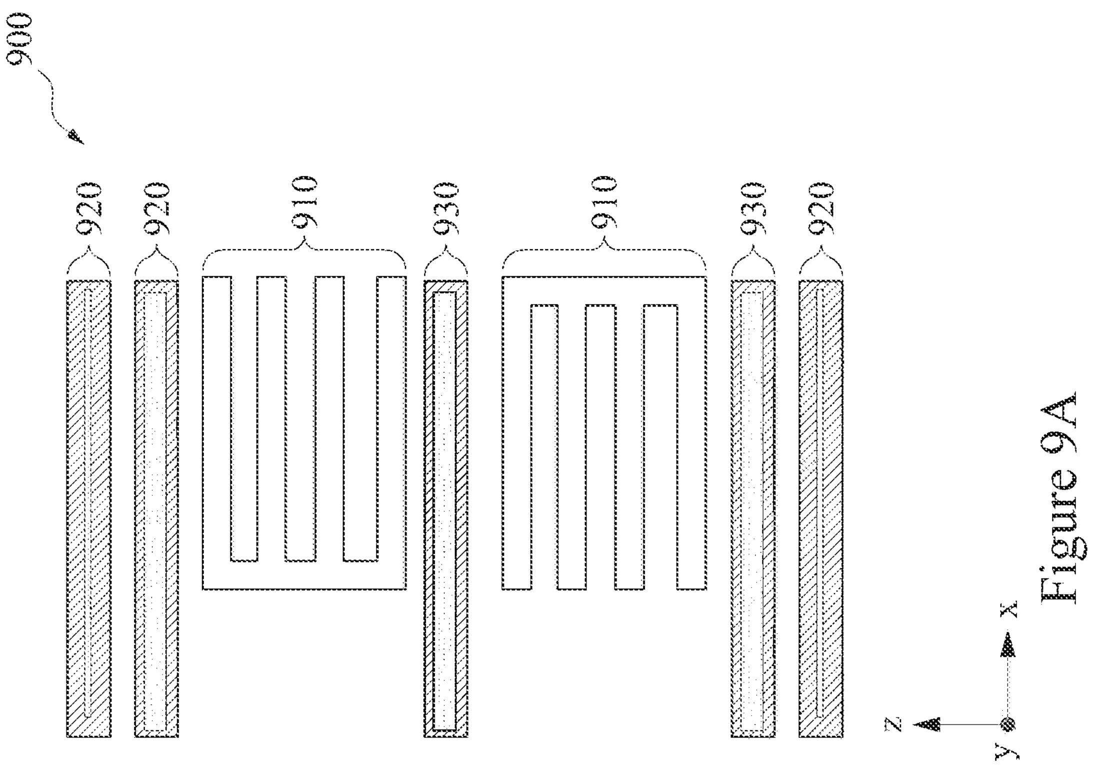

FIG. 9A and FIG. 9B are illustrations of top-level views of seventh patterns for interconnect structure 900 and interconnect structure 950, respectively, for semiconductor structure 100 according to some embodiments. In some embodiments, interconnect structure 900 can be implemented in the odd-numbered metallization layers of semiconductor structure 100 (e.g., first metallization layer 130, third metallization layer 150, and fifth metallization layer 170) and interconnect structure 950 can be implemented in the even-numbered metallization layers of semiconductor structure 100 (e.g., second metallization layer 140 and fourth metallization layer 160)—or vice versa.

Referring to FIG. 9A, interconnect structure 900 includes metal lines 910 and dummy metal lines 920 and 930. In some embodiments, metal lines 910 can represent metal lines 134, 154, and 174 and dummy metal lines 920 and 930 can represent dummy metal lines 136, 156, and 176 of semiconductor structure 100. Metal lines 910 can have elongated sides in a first direction, such as an x-direction. In some embodiments, dummy metal lines 920 and 930 are disposed adjacent to metal lines 910 and have a rectangular shape with an elongated side that extends in the same direction as the elongated sides of metal lines 910—e.g., extends in the first direction, such as the x-direction. In some embodiments, if metal lines 910 have elongated sides in different directions (e.g., elongated sides in the x- and z-directions), then dummy metal lines 920 and 930 can have a rectangular shape with an elongated side in the same direction as a majority of elongated sides of metal lines 910.

Referring to FIG. 9B, interconnect structure 950 includes metal lines 960 and dummy metal lines 970 and 980. In some embodiments, metal lines 960 can represent metal lines 144 and 164 and dummy metal lines 970 and 980 can represent dummy metal lines 146 and 166 of semiconductor structure 100. Metal lines 960 can have elongated sides in a second direction perpendicular to the first direction, such as a z-direction. In some embodiments, dummy metal lines 970 and 980 are disposed adjacent to metal lines 960 and have a rectangular shape with an elongated side that extends in the same direction as the elongated sides of metal lines 960—e.g., extends in the second direction, such as the z-direction. In some embodiments, if metal lines 960 have elongated sides in different directions (e.g., elongated sides in the x- and z-directions), then dummy metal lines 970 and 980 can have a rectangular shape with an elongated side in the same direction as a majority of elongated sides of metal lines 960.

Figure 10B:
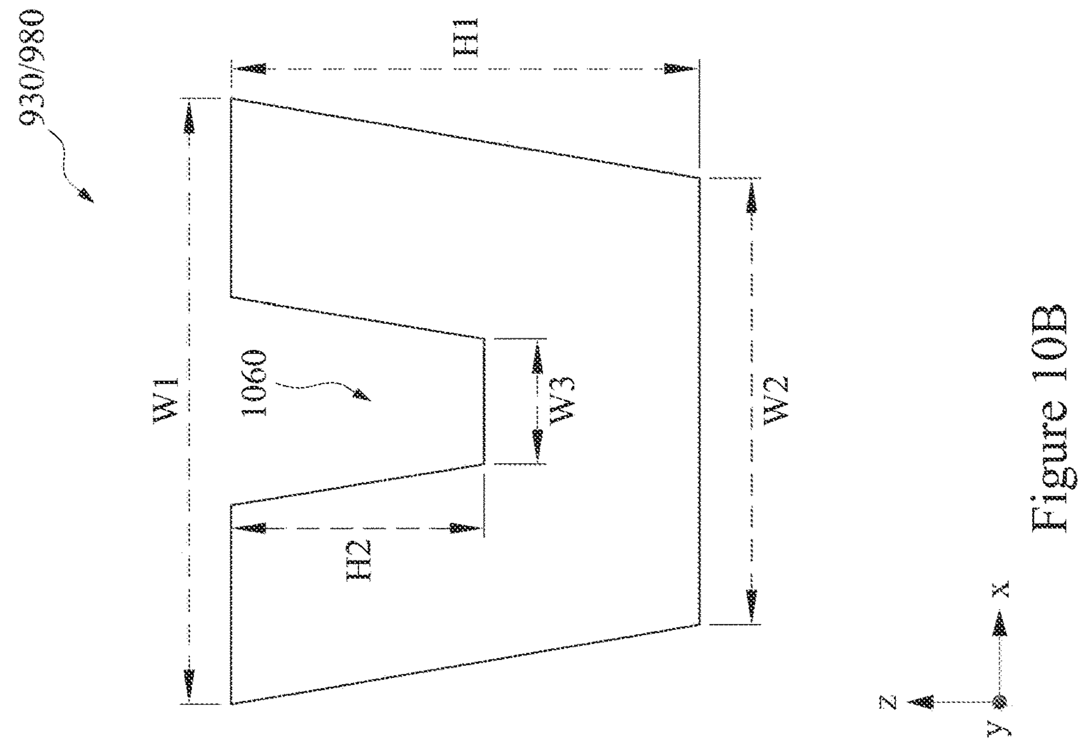
FIGS. 10A and 10B are illustrations of cross-sectional views of dummy metal lines for interconnect structures for a semiconductor structure, according to some embodiments.
Figure 10A:
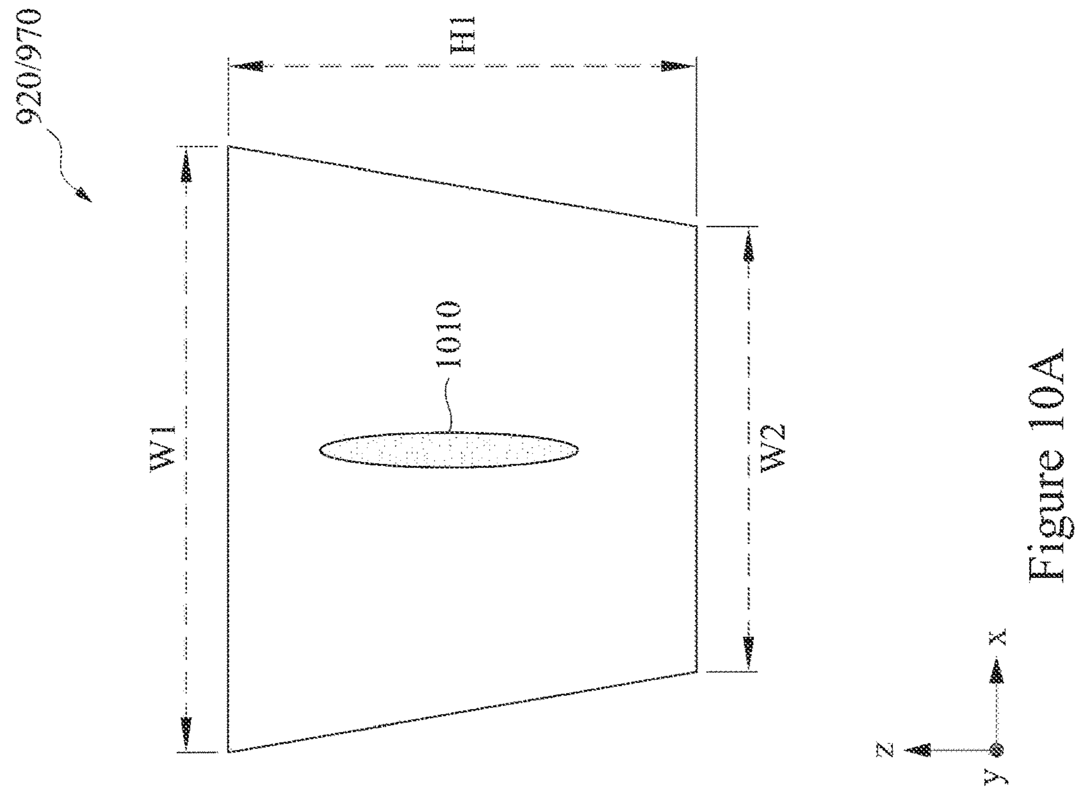

Referring to FIGS. 9A and 9B, each of dummy metal lines 920, 930, 970, and 980 can have substantially the same or different dimensions, according to some embodiments. Dummy metal lines 920 and 970 can have a similar shape and structure, according to some embodiments. FIG. 10A is an illustration of a cross-sectional view of dummy metal lines 920 and 970, according to some embodiments. In some embodiments, dummy metal lines 920 and 970 can have a trapezoidal cross-section with a top width W1, a bottom width W2, and a height H1. The dimensions of top width W1 can be between about 0.5 μm and about 0.8 μm. The dimensions of bottom width W2 can be between about 0.3 μm and about 0.6 μm. The dimensions of height H1 can be between about 0.3 μm and about 0.6 μm. In some embodiments, dummy metal lines 920 and 970 can include a void structure 1010, which can encompass a dielectric material or air. The dielectric material can be an insulating material, such as silicon oxide, SiN, SiCN, SiOCN, and silicon germanium oxide.

Dummy metal lines 930 and 980 can have a similar shape and structure, according to some embodiments. FIG. 10B is an illustration of a cross-sectional view of dummy metal lines 930 and 980, according to some embodiments. In some embodiments, dummy metal lines 920 and 970 can have a trapezoidal cross-section with a concave central portion 1060. Dummy metal lines 920 and 930 can have top width W1, bottom width W2, a concave central portion width W3, height H1, and a concave central portion height H2. Top width W1, bottom width W2, and height H1 can have substantially the same dimensions as their corresponding dimensions in dummy metal lines 920 and 970 (of FIG. 10A). Concave central portion width W3 can be between about 0.1 μm and about 0.4 μm. Concave central portion height H2 can be between about 0.1 μm and about 0.3 μm.

Referring to FIGS. 9A and 9B, an elongated side dimension of dummy metal lines 920, 930, 970, and 980 can be longer than that of metal lines 910 and 960, according to some embodiments. A ratio of an elongated side dimension of dummy metal line 920/930/970/980 to an elongated side dimension of metal line 910/960 can be about 1 to about 3, according to some embodiments.

Figure 11B:
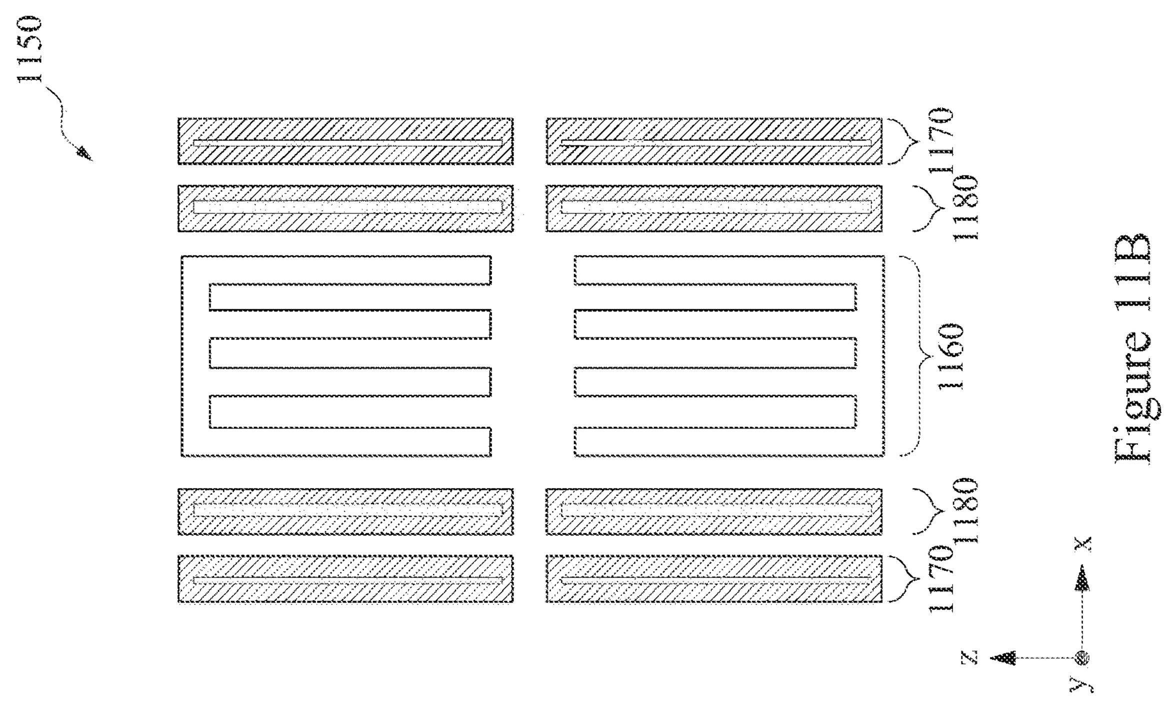
FIGS. 11A and 11B are illustrations of top-level views of eighth patterns for interconnect structures for a semiconductor structure, according to some embodiments.
Figure 11A:
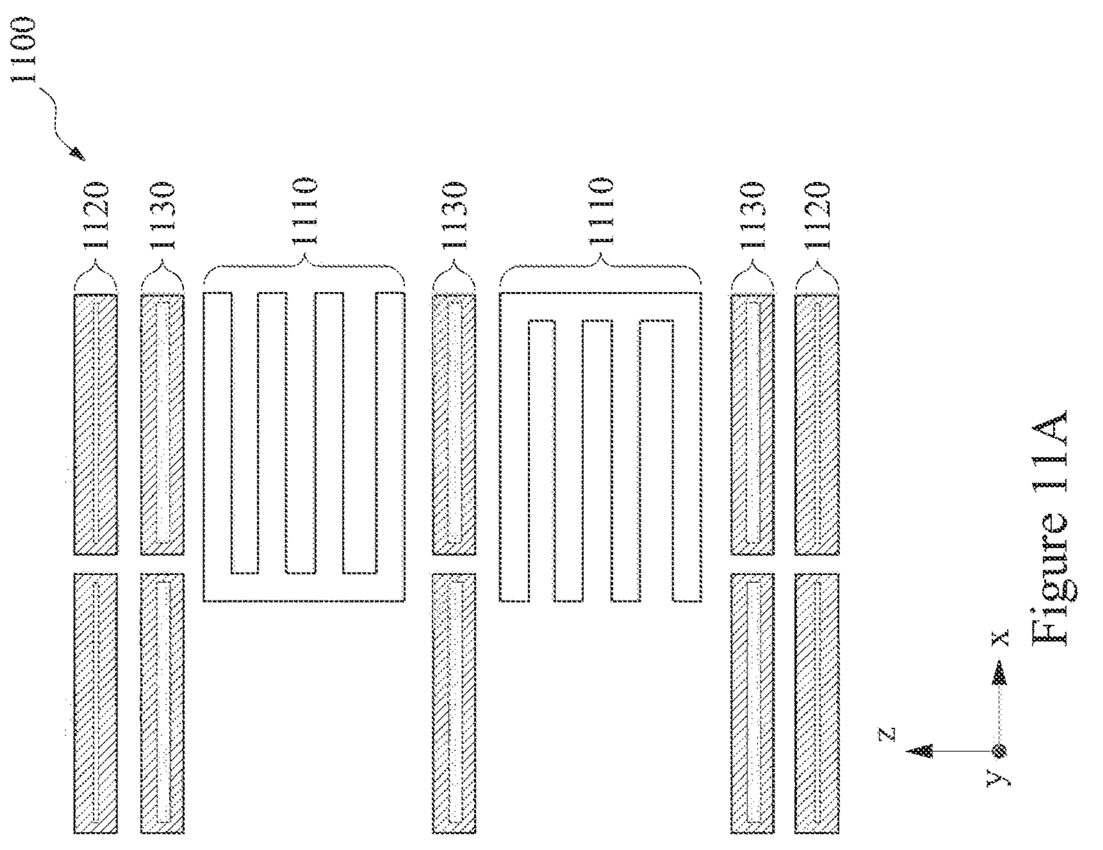

FIG. 11A and FIG. 11B are illustrations of top-level views of eighth patterns for interconnect structure 1100 and interconnect structure 1150, respectively, for semiconductor structure 100 according to some embodiments. In some embodiments, interconnect structure 1100 can be implemented in the odd-numbered metallization layers of semiconductor structure 100 (e.g., first metallization layer 130, third metallization layer 150, and fifth metallization layer 170) and interconnect structure 1150 can be implemented in the even-numbered metallization layers of semiconductor structure 100 (e.g., second metallization layer 140 and fourth metallization layer 160)—or vice versa.

Referring to FIG. 11A, interconnect structure 1100 includes metal lines 1110 and dummy metal lines 1120 and 1130. In some embodiments, metal lines 1110 can represent metal lines 134, 154, and 174 and dummy metal lines 1120 and 1130 can represent dummy metal lines 136, 156, and 176 of semiconductor structure 100. Metal lines 1110 can have elongated sides in a first direction, such as an x-direction. In some embodiments, dummy metal lines 1120 and 1130 are disposed adjacent to metal lines 1110 and have a rectangular shape with an elongated side that extends in the same direction as the elongated sides of metal lines 1110—e.g., extends in the first direction, such as the x-direction. In some embodiments, if metal lines 1110 have elongated sides in different directions (e.g., elongated sides in the x- and z-directions), then dummy metal lines 1120 and 1130 can have a rectangular shape with an elongated side in the same direction as a majority of elongated sides of metal lines 1110.

Referring to FIG. 11B, interconnect structure 1150 includes metal lines 1160 and dummy metal lines 1170 and 1180. In some embodiments, metal lines 1160 can represent metal lines 144 and 164 and dummy metal lines 1170 and 1180 can represent dummy metal lines 146 and 166 of semiconductor structure 100. Metal lines 1160 can have elongated sides in a second direction perpendicular to the first direction, such as a z-direction. In some embodiments, dummy metal lines 1170 and 1180 are disposed adjacent to metal lines 1160 and have a rectangular shape with an elongated side that extends in the same direction as the elongated sides of metal lines 1160—e.g., extends in the second direction, such as the z-direction. In some embodiments, if metal lines 1160 have elongated sides in different directions (e.g., elongated sides in the x- and z-directions), then dummy metal lines 1170 and 1180 can have a rectangular shape with an elongated side in the same direction as a majority of elongated sides of metal lines 1160.

Referring to FIGS. 11A and 11B, each of dummy metal lines 1120, 1130, 1170, and 1180 can have substantially the same or different dimensions, according to some embodiments. Dummy metal lines 1120 and 1170 can have a similar shape and structure, according to some embodiments. In some embodiments, dummy metal lines 1120 and 1170 can be the same shape and structure of dummy metal lines 920 and 970 shown in FIG. 10A. Also, dummy metal lines 1130 and 1180 can have a similar shape and structure, according to some embodiments. In some embodiments, dummy metal lines 1130 and 1180 can be the same shape and structure of dummy metal lines 930 and 980 shown in FIG. 10B.

Referring to FIGS. 11A and 11B, an elongated side dimension of dummy metal lines 1120, 1130, 1170, and 1180 can be shorter than, substantially equal to, or longer than that of metal lines 1110 and 1160, according to some embodiments. A ratio of an elongated side dimension of dummy metal line 1120/1130/1170/1180 to an elongated side dimension of metal line 1110/1160 can be about 0.5 to about 1.5, according to some embodiments.

The interconnect structures illustrated in FIGS. 3A, 3B, 4A, 4B, 5A, 5B, 6A, 6B, 7A, 7B, 8A, 8B, 9A, 9B, 11A, and 11B are examples that show, among other things, a directional arrangement of dummy metal lines between consecutive metallization layers. For example, the dummy metal lines in a first metallization layer can have elongated sides that extend in a first direction. The dummy metal lines in a second metallization layer-directly above the first metallization layer—can have elongated sides that extend in a second direction perpendicular to the first direction. This directional arrangement of dummy metal lines among the metallization layers can be applied to two or more metallization layers, thus reducing tensile stress and stretching forces in the BEOL manufacturing process of semiconductor structures. As a result, wafer warpage can be reduced (e.g., by over 50%).

Figure 12:
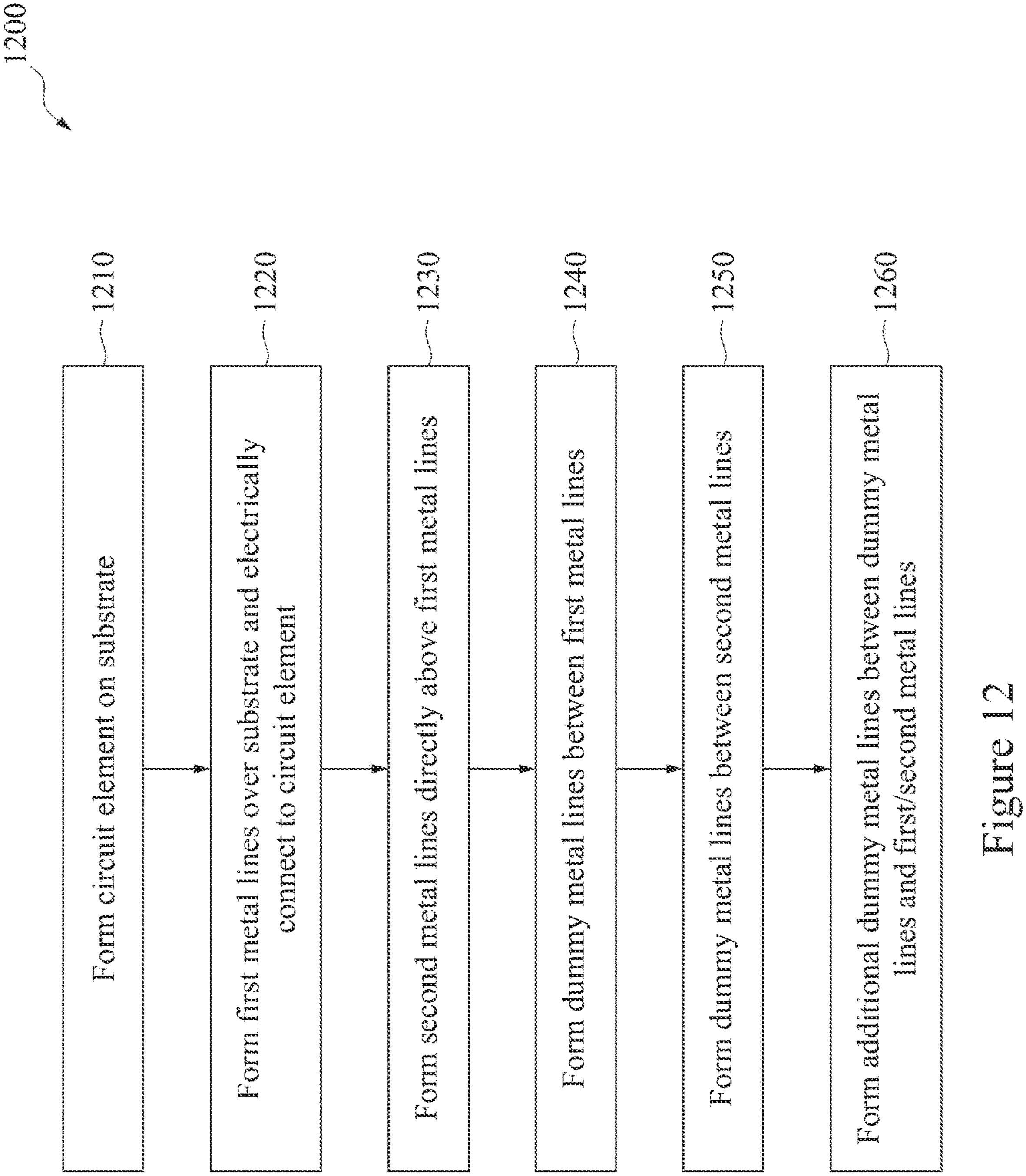
FIG. 12 is an illustration of a method to generate interconnect structure layout patterns for a semiconductor device, according to some embodiments.

FIG. 12 is an illustration of a method 1200 to generate interconnect structure layout patterns for a semiconductor device, according to some embodiments. The operations depicted in method 1200 can be performed by, for example, an electronic design automation (EDA) tool that operates on a computer system, such as an example computer system 1600 described below with respect to FIG. 16. It is to be appreciated that not all operations may be needed to perform the disclosure provided herein and that one or more additional operations may be performed. Further, some of the operations may be performed concurrently or in a different order than shown in method 1200.

Method 1200 can be performed to implement the interconnect structures shown in FIGS. 1, 3A, 3B, 4A, 4B, 5A, 5B, 6A, 6B, 7A, 7B, 8A, 8B, 9A, 9B, 11A, and 11B. Based on the description herein, method 1200 can be used to implement other interconnect structures, which are within the scope of the present disclosure. To facilitate in the description of method 1200, FIGS. 13A, 13B, 14A, 14B, 15A, and 15B are illustrations of interconnect structures for generating the integrated layout patterns for the semiconductor device.

Referring to FIG. 12, in operation 1210, a circuit element is formed on a substrate. Referring to FIG. 1, the circuit element can be circuit element 120, which is a semiconductor device formed on substrate 110. In some embodiments, circuit element 120 can be a transistor device, such as a GAAFET and a finFET. Circuit element 120 can also be an electronic component, such as a capacitor and a resistor. Other types of semiconductor devices can be formed in substrate 110. Also, more than one semiconductor device (e.g., circuit element 120) can be formed in substrate 110. These other types and number of semiconductor devices are within the scope of the present disclosure.

Referring to FIG. 12, in operation 1220, first metal lines are formed over the substrate and electrically connected to the circuit element. Referring to FIG. 1, the first metal lines can be metal lines 134 in first metallization layer 130, which are electrically connected to circuit element 120 through via structures 132. The first metal lines can also be metal lines 154 in third metallization layer 150 and metal lines 174 in fifth metallization layer 170.

Figure 13B:
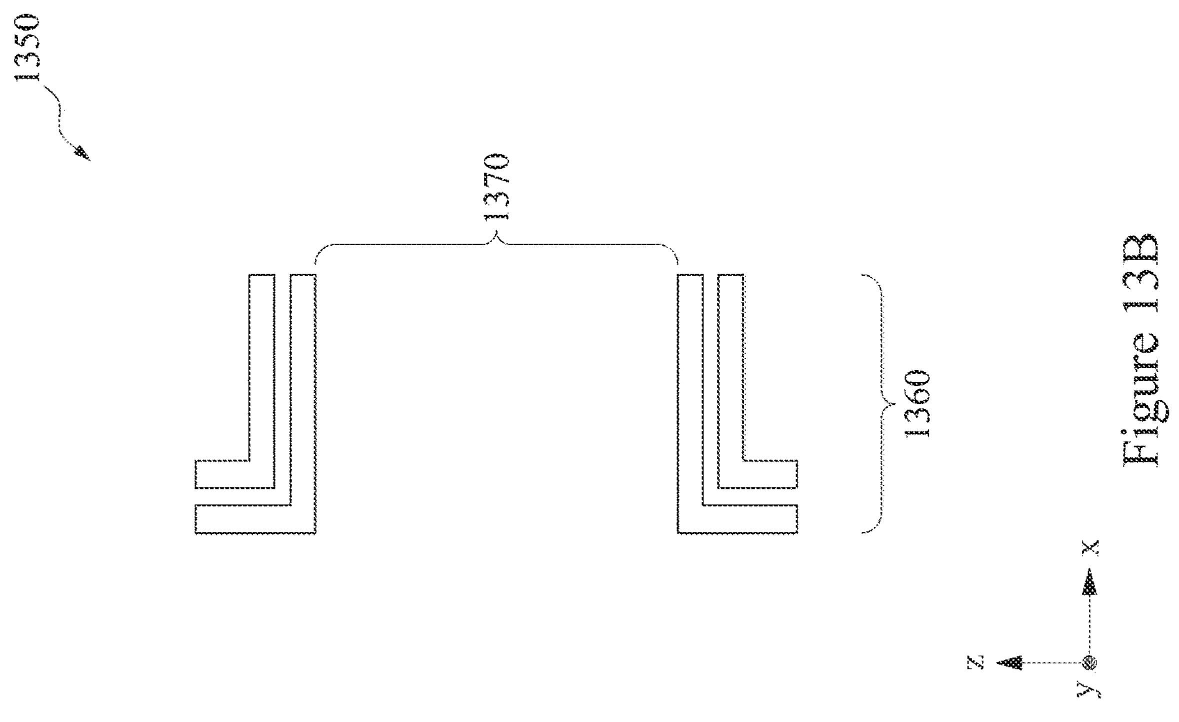
FIGS. 13A, 13B, 14A, 14B, 15A, and 15B are illustrations of interconnect structures for generating integrated layout patterns for a semiconductor device, according to some embodiments.
Figure 13A:
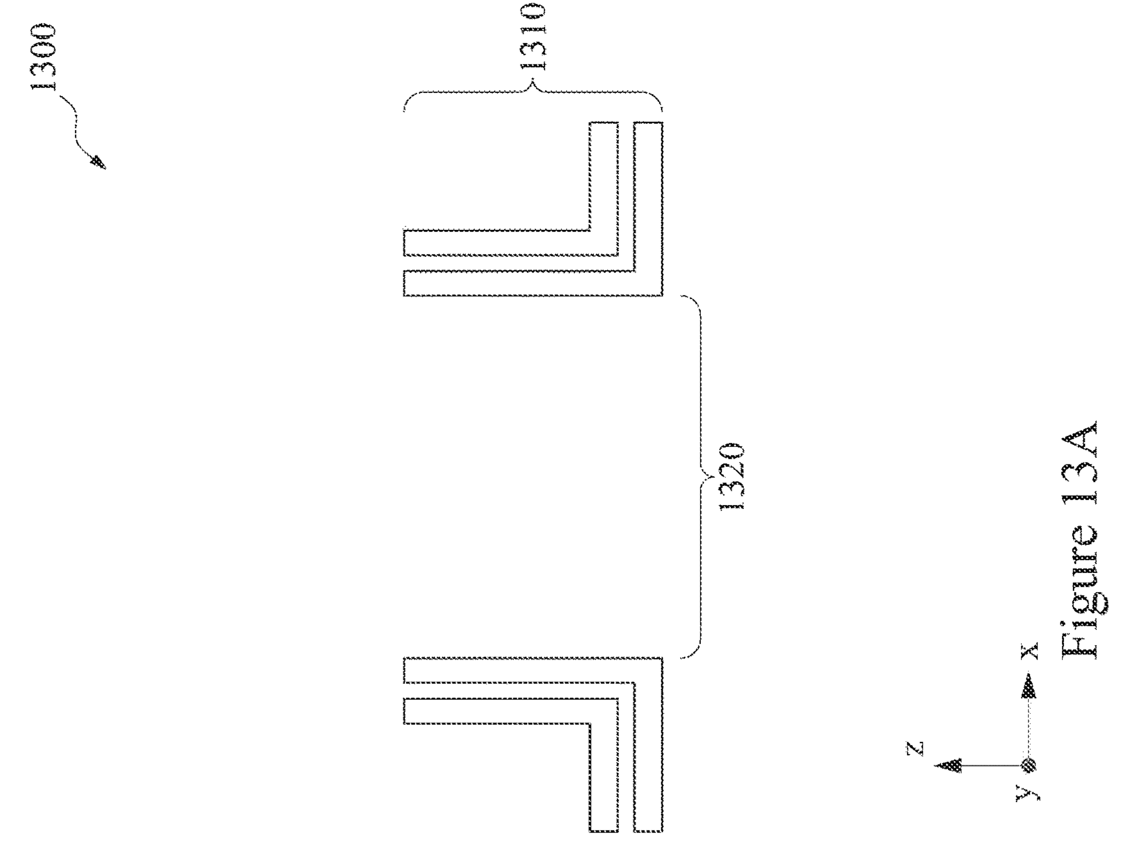

FIG. 13A is an illustration of a top-level view of a metal line pattern 1300 for the first metal lines, according to some embodiments. Metal line pattern 1300 includes metal lines 1310 that electrically connect to one or more underlying circuit elements through one or more via structures (not shown in FIG. 13A). Due to a routing pattern of metal lines 1310 (e.g., based on the interconnect routing by the EDA tool), a spacing 1320 exists between metal lines 1310. In some embodiments, metal lines 1310 can represent metal lines 310 of FIG. 3A, metal lines 410 of FIG. 4A, metal lines 510 of FIG. 5A, metal lines 610 of FIG. 6A, metal lines 710 of FIG. 7A, metal lines 810 of FIG. 8A, metal lines 910 of FIG. 9A, and metal lines 1110 of FIG. 11A.

Referring to FIG. 12, in operation 1230, second metal lines are formed directly above the first metal lines. Referring to FIG. 1, the second metal lines can be metal lines 144 in second metallization layer 140, which are electrically connected to first metallization layer 130 through via structures 142. The second metal lines can also be metal lines 164 in fourth metallization layer 160.

FIG. 13B is an illustration of a top-level view of a metal line pattern 1350 for the second metal lines, according to some embodiments. Metal line pattern 1350 includes metal lines 1360 that electrically connect to an underlying metallization layer through one or more via structures (not shown in FIG. 13B). Due to a routing pattern of metal lines 1360 (e.g., based on the interconnect routing by the EDA tool), a spacing 1370 exists between metal lines 1360. In some embodiments, metal lines 1360 can represent metal lines 360 of FIG. 3B, metal lines 460 of FIG. 4B, metal lines 560 of FIG. 5B, metal lines 660 of FIG. 6B, metal lines 760 of FIG. 7B, metal lines 860 of FIG. 8B, metal lines 960 of FIG. 9B, and metal lines 1160 of FIG. 11B.

Referring to FIG. 12, in operation 1240, dummy metal lines are formed between the first metal lines, according to some embodiments. Referring to FIG. 1, the dummy metal lines can be dummy metal lines 136 in first metallization layer 130, which are electrically isolated from metal lines 134 by ILD layer 138. The dummy metal lines can also be dummy metal lines 156 in third metallization layer 150 and dummy metal lines 176 in fifth metallization layer 170.

Figure 14B:
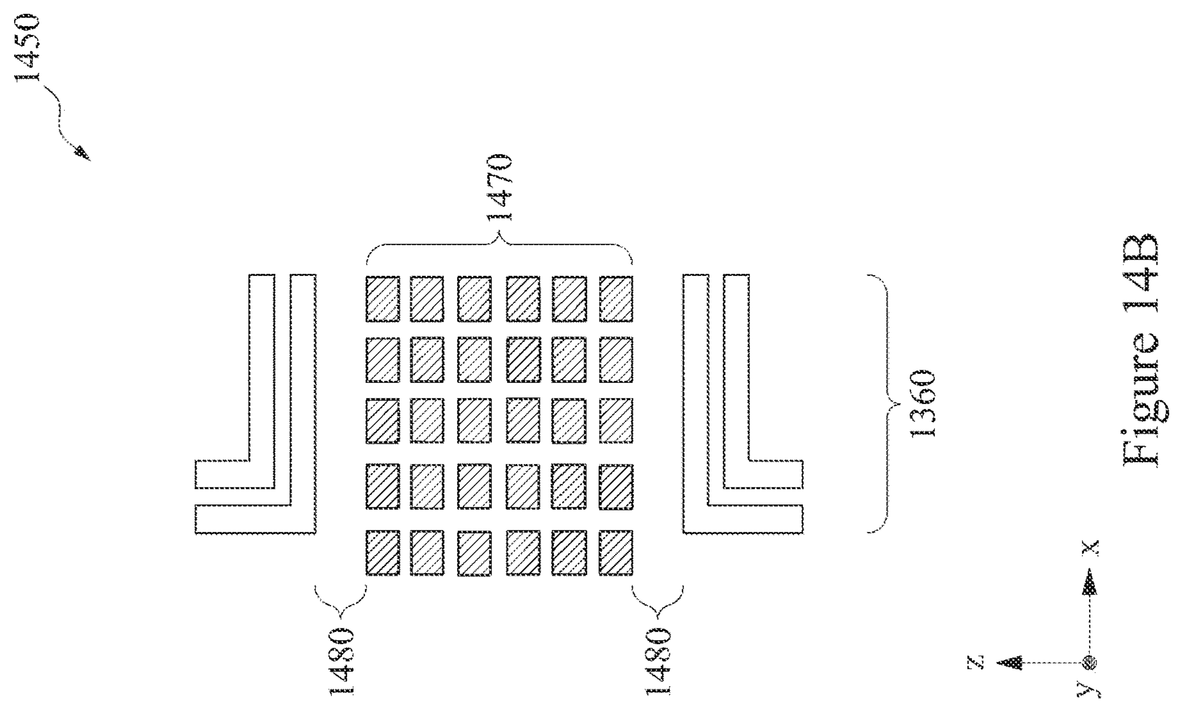
Figure 14A:
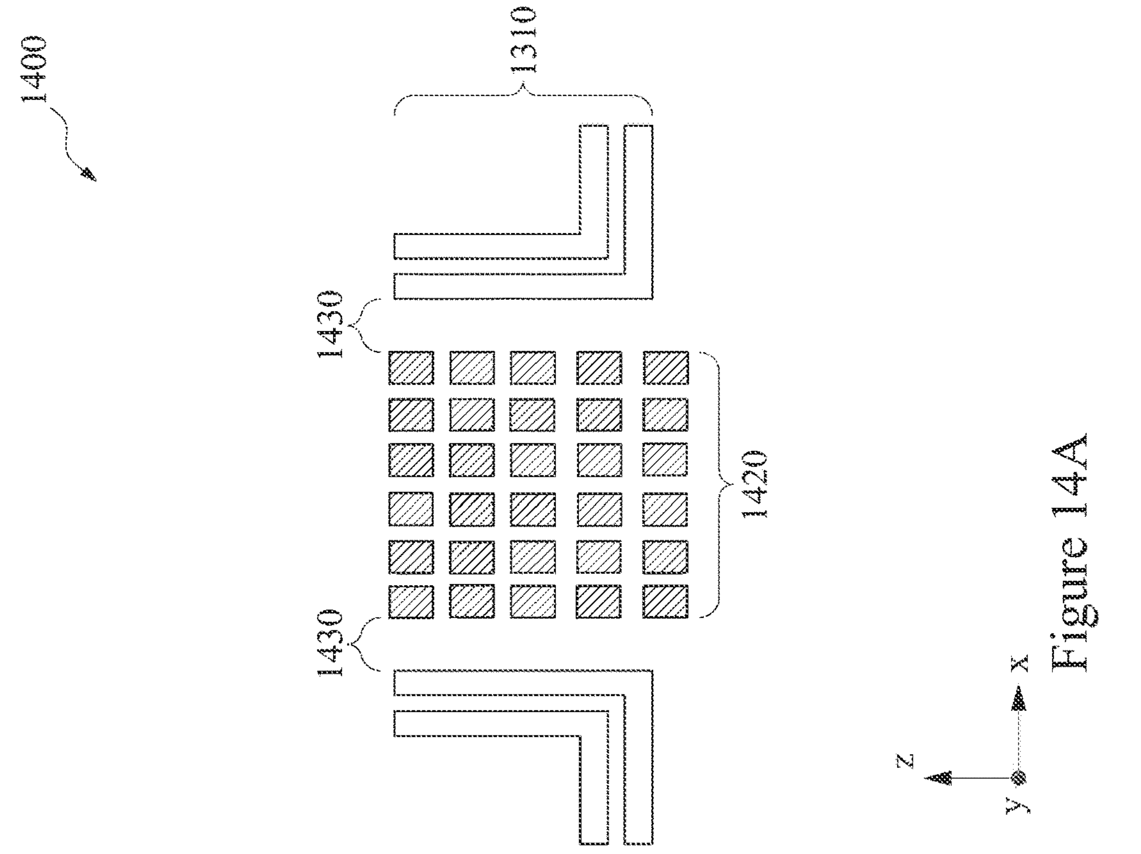

FIG. 14A is an illustration of a top-level view of a dummy metal line pattern 1400 for dummy metal lines formed between the first metal lines, according to some embodiments. Dummy metal line pattern 1400 includes dummy metal lines 1420 disposed in space 1320 (of FIG. 13A) between metal lines 1310. Dummy metal lines 1420 can have a rectangular shape and elongated sides in a first direction, such as a z-direction. In some embodiments, the elongated sides of dummy metal lines 1420 extend in the same direction as the elongated sides of metal lines 1310—e.g., extends in the first direction, such as the z-direction. Due to a routing pattern and size of dummy metal lines 1420 (e.g., based on the interconnect routing by the EDA tool), spacings 1430 may exist between dummy metal lines 1420 and metal lines 1310, according to some embodiments. In some embodiments, a width of spacings 1430 is less than that of dummy metal lines 1420.

Each of dummy metal lines 1420 can have substantially the same or different dimensions, according to some embodiments. The shape of dummy metal lines 1420 can be shapes other than rectangles, such as a square. In some embodiments, an elongated side dimension of dummy metal lines 1420 can be between about 0.2 μm and about 10 μm. An elongated side dimension of metal lines 1310 can be between about 0.2 μm and about 10 μm. A ratio of an elongated side dimension of dummy metal line 1420 to an elongated side dimension of metal line 1310 can be about 0.02 to about 1, according to some embodiments. In some embodiments, dummy metal lines 1420 can represent dummy metal lines 320 of FIG. 3A, dummy metal lines 420 and 430 of FIG. 4A, dummy metal lines 520 of FIG. 5A, dummy metal lines 620 of FIG. 6A, dummy metal lines 720 and 730 of FIG. 7A, dummy metal lines 820 and 830 of FIG. 8A, dummy metal lines 920 and 930 of FIG. 9A, and dummy metal lines 1120 and 1130 of FIG. 11A.

Referring to FIG. 12, in operation 1250, dummy metal lines are formed between the second metal lines, according to some embodiments. Referring to FIG. 1, the dummy metal lines can be dummy metal lines 146 in second metallization layer 140, which are electrically isolated from metal lines 144 by ILD layer 148. The dummy metal can also be dummy metal lines 166 in fourth metallization layer 160.

FIG. 14B is an illustration of a top-level view of a dummy metal line pattern 1450 for dummy metal lines formed between the second metal lines, according to some embodiments. Dummy metal line pattern 1450 includes dummy metal lines 1470 disposed in space 1370 (of FIG. 13B) between metal lines 1360. Dummy metal lines 1470 can have a rectangular shape and elongated sides in a second direction perpendicular to the first direction, such as an x-direction. In some embodiments, the elongated sides of dummy metal lines 1470 extend in the same direction as the elongated sides of metal lines 1360—e.g., extends in the second direction, such as the x-direction. Due to a routing pattern and size of dummy metal lines 1470 (e.g., based on the interconnect routing by the EDA tool), spacings 1480 may exist between dummy metal lines 1470 and metal lines 1360, according to some embodiments. In some embodiments, a width of spacings 1480 is less than that of dummy metal lines 1470.

Each of dummy metal lines 1470 can have substantially the same or different dimensions, according to some embodiments. The shape of dummy metal lines 1470 can be shapes other than rectangles, such as a square. In some embodiments, an elongated side dimension of dummy metal lines 1470 can be between about 0.2 μm and about 10 μm. An elongated side dimension of metal lines 1360 can be between about 0.2 μm and about 10 μm. A ratio of an elongated side dimension of dummy metal line 1470 to an elongated side dimension of metal line 1360 can be about 0.02 to about 1, according to some embodiments. In some embodiments, dummy metal lines 1470 can represent dummy metal lines 370 of FIG. 3B, dummy metal lines 470 and 430 of FIG. 4B, dummy metal lines 570 of FIG. 5B, dummy metal lines 670 of FIG. 6B, dummy metal lines 770 and 780 of FIG. 7B, dummy metal lines 870 and 880 of FIG. 8B, dummy metal lines 970 and 980 of FIG. 9B, and dummy metal lines 1170 and 1180 of FIG. 11B.

Referring to FIG. 12, in operation 1260, additional dummy metal lines are formed between dummy metal lines and the first metal lines, between dummy metal lines and the second metal lines, or both. FIG. 15A is an illustration of a top-level view of an additional dummy metal line pattern 1500 formed between dummy metal lines 1420 and metal lines 1310, according to some embodiments. Additional dummy metal line pattern 1500 includes dummy metal lines 1530 disposed in spacings 1430 (of FIG. 14A). Dummy metal lines 1530 can have a rectangular shape and elongated sides in a first direction, such as a z-direction. In some embodiments, the elongated sides of dummy metal lines 1530 extend in the same direction as the elongated sides of dummy metal lines 1420—e.g., extends in the first direction, such as the z-direction. Dummy metal lines 1530 can have substantially the same length (e.g., in the z-direction) as that of dummy metal lines 1420 and a width (e.g., in the x-direction) less than that of dummy metal lines 1420, according to some embodiments.

Figure 15B:
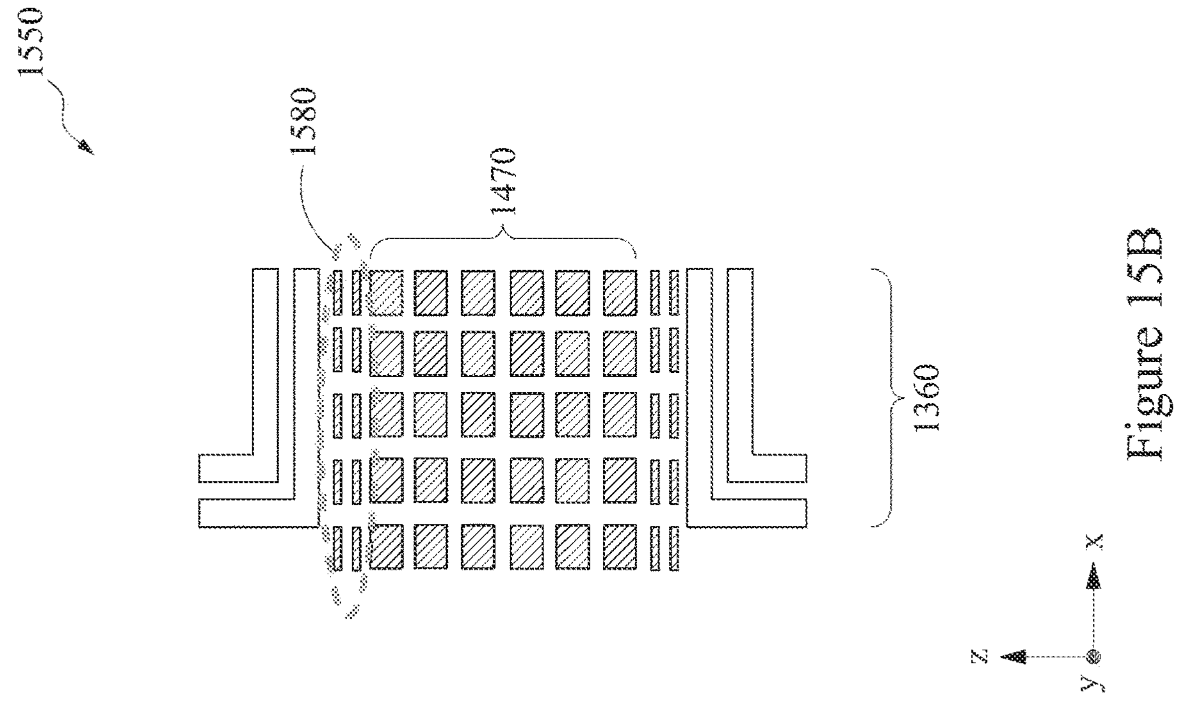
Figure 15A:
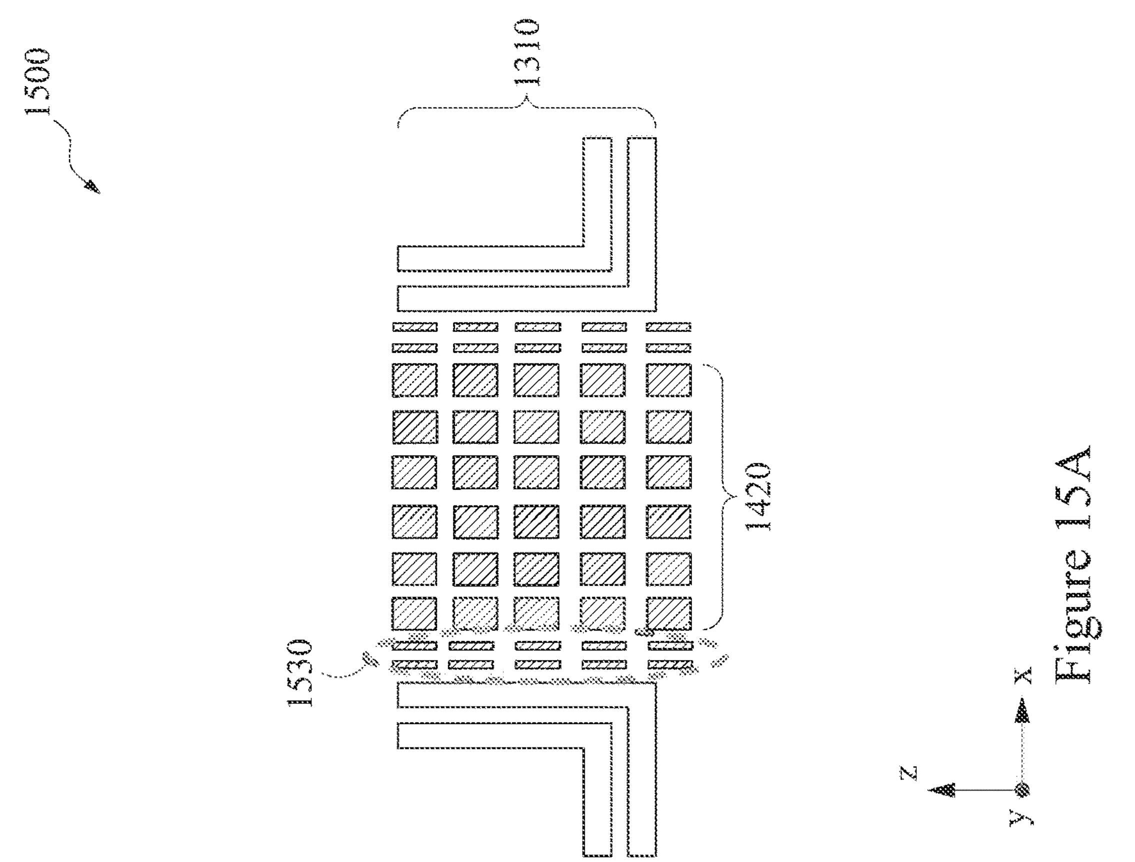

FIG. 15B is an illustration of a top-level view of an additional dummy metal line pattern 1550 formed between dummy metal lines and the second metal lines, according to some embodiments. Additional dummy metal line pattern 1550 includes dummy metal lines 1580 disposed in spacings 1480 (of FIG. 14B). Dummy metal lines 1580 can have a rectangular shape and elongated sides in a second direction perpendicular to the first direction, such as an x-direction. In some embodiments, the elongated sides of dummy metal lines 1580 extend in the same direction as the elongated sides of dummy metal lines 1470—e.g., extends in the second direction, such as the x-direction. Dummy metal lines 1580 can have substantially the same length (e.g., in the z-direction) as that of dummy metal lines 1470 and a width (e.g., in the x-direction) less than that of dummy metal lines 1470, according to some embodiments.

In some embodiments, operation 1260 can be optional. For example, if a width of spacings 1430 and spacings 1480 (of FIGS. 14A and 14B, respectively) is less than a width of dummy metal lines 1530 and 1580, then dummy metal lines 1530 and 1580 may not be disposed in the spacings.

After operation 1260, method 1200 can be repeated for additional metallization layers. Further, based on the description herein, the operations of method 1200 can be applied to two or more consecutive metallization layers in semiconductor structure 100 of FIG. 1. For example, method 1200 can be applied to first metallization layer 130 and second metallization layer 140, to second metallization layer 140 and third metallization layer 150, to third metallization layer 150 and fourth metallization layer 160, to fourth metallization layer 160 and fifth metallization layer 170, or to any number of consecutive metallization layers in semiconductor structure 100. Embodiments of the present disclosure are also applicable to semiconductor structures with interconnect structures having more or less than five metallization layers. These semiconductor structures are within the scope of the present disclosure.

Figure 16:
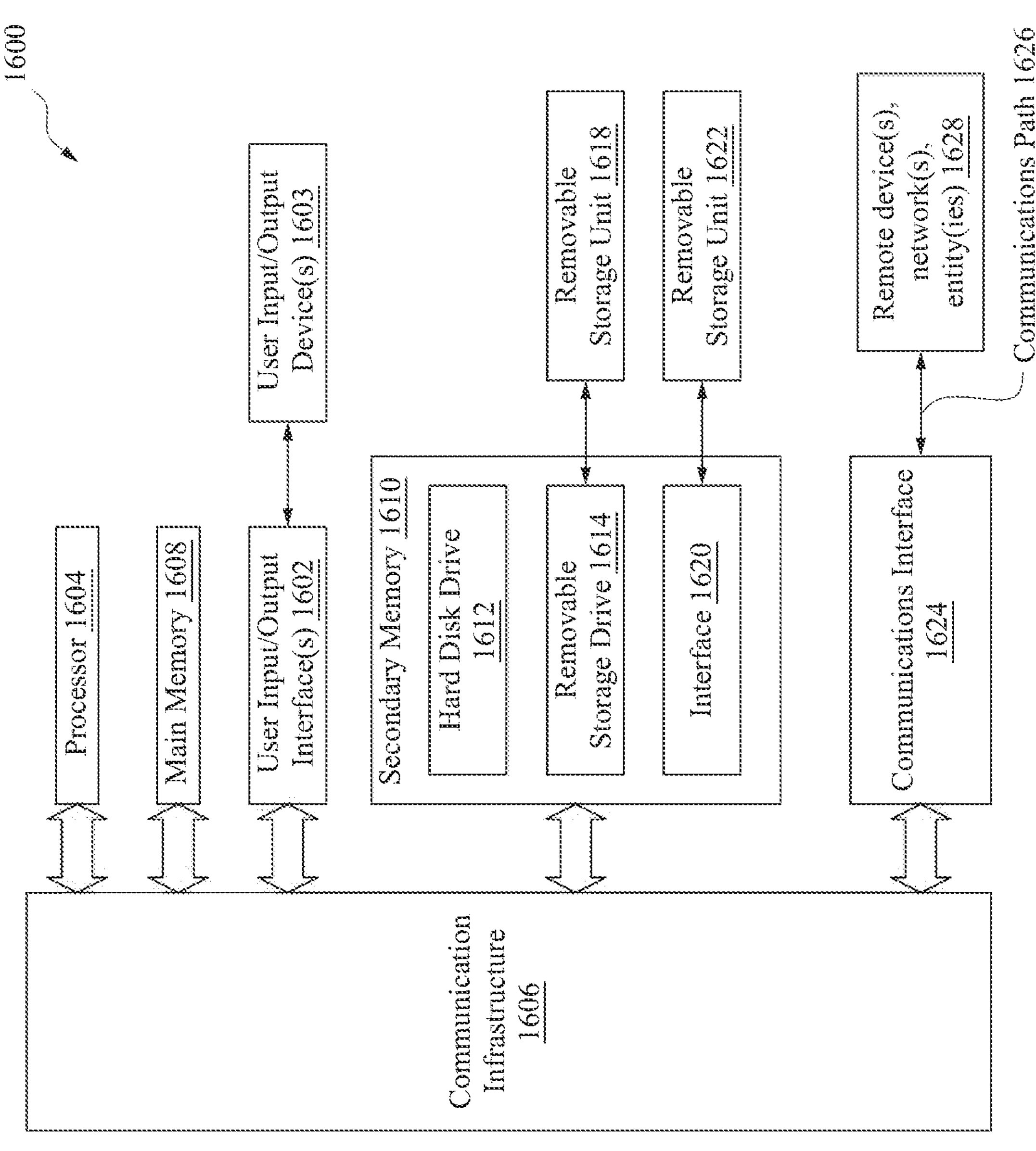
FIG. 16 is an illustration of an example computer system in which various embodiments of the present disclosure can be implemented, according to some embodiments of the present disclosure.

FIG. 16 is an illustration of an example computer system 1600 in which various embodiments of the present disclosure can be implemented, according to some embodiments. Computer system 1600 can be any well-known computer capable of performing the functions and operations described herein. For example, computer system 1600 can be capable of generating interconnect structure layout patterns for a semiconductor device using, for example, an EDA tool. Computer system 1600 can be used, for example, to execute one or more operations in method 1200 of FIG. 12, which describes an example method for generating interconnect structure layout patterns for a semiconductor device.

Computer system 1600 includes one or more processors (also called central processing units, or CPUs), such as a processor 1604. Processor 1604 is connected to a communication infrastructure or bus 1606. Computer system 1600 also includes input/output device(s) 1603, such as monitors, keyboards, pointing devices, etc., that communicate with communication infrastructure or bus 1606 through input/output interface(s) 1602. An EDA tool can receive instructions to implement functions and operations described herein—e.g., method 1200 of FIG. 12—via input/output device(s) 1603. Computer system 1600 also includes a main or primary memory 1608, such as random access memory (RAM). Main memory 1608 can include one or more levels of cache. Main memory 1608 has stored therein control logic (e.g., computer software) and/or data. In some embodiments, the control logic (e.g., computer software) and/or data can include one or more of the operations described above with respect to method 1200 of FIG. 12.

Computer system 1600 can also include one or more secondary storage devices or memory 1610. Secondary memory 1610 can include, for example, a hard disk drive 1612 and/or a removable storage device or drive 1614. Removable storage drive 1614 can be a floppy disk drive, a magnetic tape drive, a compact disk drive, an optical storage device, tape backup device, and/or any other storage device/drive.

Removable storage drive 1614 can interact with a removable storage unit 1618. Removable storage unit 1618 includes a computer usable or readable storage device having stored thereon computer software (control logic) and/or data. Removable storage unit 1618 can be a floppy disk, magnetic tape, compact disk, DVD, optical storage disk, and/or any other computer data storage device. Removable storage drive 1614 reads from and/or writes to removable storage unit 1618 in a well-known manner.

According to some embodiments, secondary memory 1610 can include other means, instrumentalities or other approaches for allowing computer programs and/or other instructions and/or data to be accessed by computer system 1600. Such means, instrumentalities or other approaches can include, for example, a removable storage unit 1622 and an interface 1620. Examples of the removable storage unit 1622 and the interface 1620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1610, removable storage unit 1618, and/or removable storage unit 1622 can include one or more of the operations described above with respect to method 1200 of FIG. 12.

Computer system 1600 can further include a communication or network interface 1624. Communication interface 1624 enables computer system 1600 to communicate and interact with any combination of remote devices, remote networks, remote entities, etc. (individually and collectively referenced by reference number 1628). For example, communication interface 1624 can allow computer system 1600 to communicate with remote devices 1628 over communications path 1626, which can be wired and/or wireless, and which can include any combination of LANs, WANs, the Internet, etc. Control logic and/or data can be transmitted to and from computer system 1600 via communication path 1626.

Figure 17:
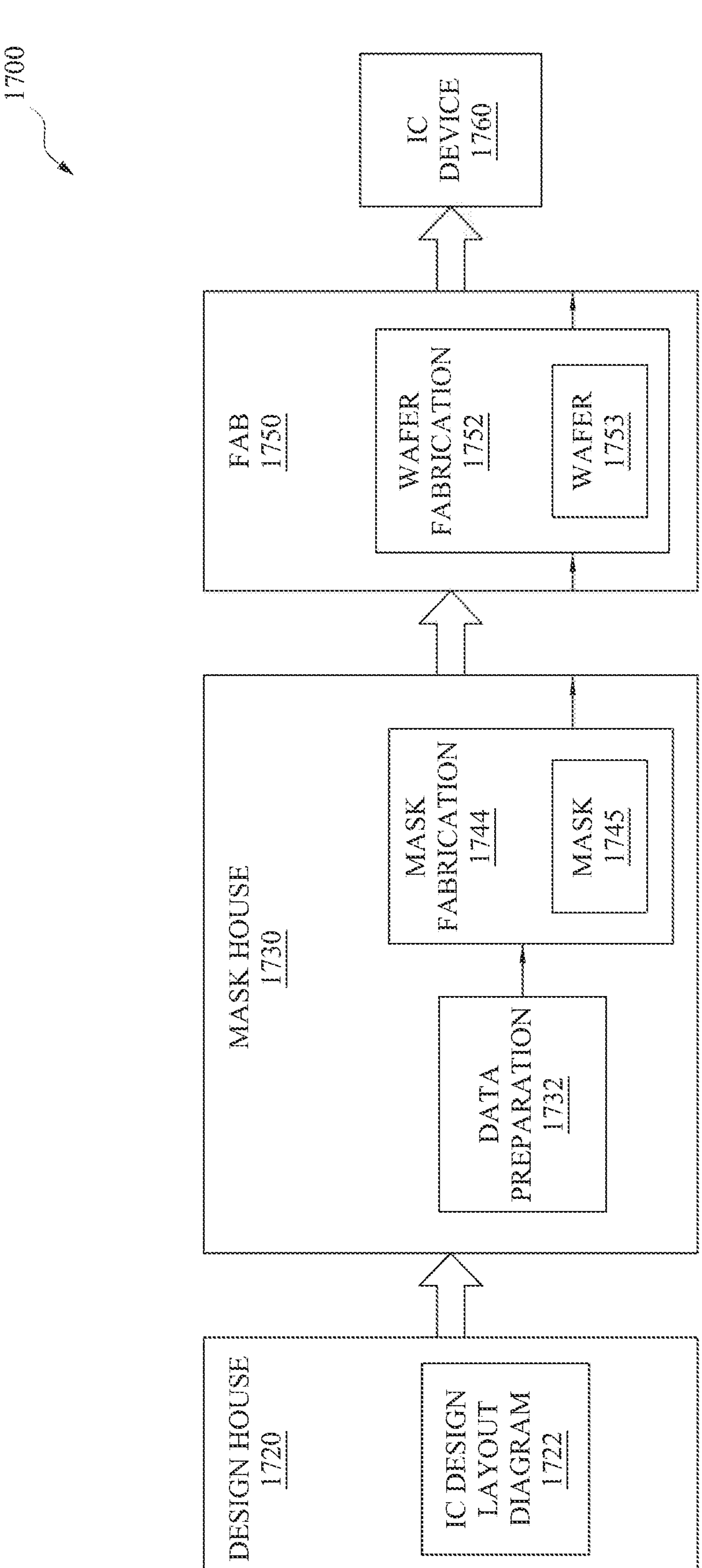
FIG. 17 is an illustration of an integrated circuit manufacturing system and associated integrated circuit manufacturing flow, according to some embodiments.

FIG. 17 is an illustration of an integrated circuit (IC) manufacturing system 1700 and associated integrated circuit manufacturing flow, according to some embodiments. In some embodiments, based on a layout diagram, at least one of one or more semiconductor masks or at least one component in a layer of a semiconductor integrated circuit (e.g., the interconnect structure patterns of FIGS. 3A, 3B, 4A, 4B, 5A, 5B, 6A, 6B, 7A, 7B, 8A, 8B, 9A, 9B, 11A, and 11B) is fabricated using IC manufacturing system 1700.

In FIG. 17, IC manufacturing system 1700 includes entities, such as a design house 1720, a mask house 1730, and an IC manufacturer/fabricator ("fab") 1750, that interact with one another in the design, development, and manufacturing cycles and/or services related to manufacturing an IC device 1760 (e.g., semiconductor structure 100 of FIG. 1). The entities in IC manufacturing system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and IC fab 1750 is owned by a single entity. In some embodiments, two or more of design house 1720, mask house 1730, and IC fab 1750 coexist in a common facility and use common resources.

Design house (or design team) 1720 generates an IC design layout diagram 1722. IC design layout diagram 1722 includes various geometrical patterns—for example, the interconnect structure patterns of FIGS. 3A, 3B, 4A, 4B, 5A, 5B, 6A, 6B, 7A, 7B, 8A, 8B, 9A, 9B, 11A, and 11B—designed for an IC device 1760—such as semiconductor structure 100 of FIG. 1. The geometrical patterns correspond to patterns of metal, oxide, or semiconductor layers that make up the various components of IC device 1760 to be fabricated. The various layers combine to form various IC features. For example, a portion of IC design layout diagram 1722 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1720 implements a proper design procedure to form IC design layout diagram 1722. The design procedure includes one or more of logic design, physical design or place and route. IC design layout diagram 1722 is presented in one or more data files having information of the geometrical patterns. For example, IC design layout diagram 1722 can be expressed in a GDSII file format or DFII file format.

Mask house 1730 includes data preparation 1732 and mask fabrication 1744. Mask house 1730 uses IC design layout diagram 1722 to manufacture one or more masks 1745 to be used for fabricating the various layers of IC device 1760 according to IC design layout diagram 1722.

Mask house 1730 performs mask data preparation 1732, where IC design layout diagram 1722 is translated into a representative data file ("RDF"). Mask data preparation 1732 provides the RDF to mask fabrication 1744. Mask fabrication 1744 includes a mask writer. The mask writer converts the RDF to an image on a substrate, such as a mask (reticle) 1745 or a semiconductor wafer 1753. The IC design layout diagram 1722 is manipulated by mask data preparation 1732 to comply with particular characteristics of the mask writer and/or requirements of IC fab 1750. In FIG. 17, data preparation 1732 and mask fabrication 1744 are illustrated as separate elements. In some embodiments, data preparation 1732 and mask fabrication 1744 can be collectively referred to as "mask data preparation."

In some embodiments, data preparation 1732 includes optical proximity correction (OPC) which uses lithography enhancement techniques to compensate for image errors, such as those that can arise from diffraction, interference, and other process effects. OPC adjusts IC design layout diagram 1722. In some embodiments, data preparation 1732 includes further resolution enhancement techniques (RET), such as off-axis illumination, sub-resolution assist features, phase-shifting masks, other suitable techniques, or combinations thereof. In some embodiments, inverse lithography technology (ILT) can also be used, which treats OPC as an inverse imaging problem.

In some embodiments, data preparation 1732 includes a mask rule checker (MRC) that checks the IC design layout diagram 1722 that has undergone processes in OPC with a set of mask creation rules which contain certain geometric and/or connectivity restrictions to ensure sufficient margins and to account for variability in semiconductor manufacturing processes. In some embodiments, the MRC modifies the IC design layout diagram 1722 to compensate for limitations during mask fabrication 1744, which may undo part of the modifications performed by OPC in order to meet mask creation rules.

In some embodiments, data preparation 1732 includes lithography process checking (LPC) that simulates processing that will be implemented by IC fab 1750 to fabricate IC device 1760. LPC simulates this processing based on IC design layout diagram 1722 to create a simulated manufactured device, such as IC device 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or combinations thereof. In some embodiments, after a simulated manufactured device has been created by LPC, if the simulated device is not close enough in shape to satisfy design rules, OPC and/or MRC can be repeated to further refine IC design layout diagram 1722.

It should be understood that the above description of data preparation 1732 has been simplified for the purposes of clarity. In some embodiments, data preparation 1732 includes additional features, such as a logic operation (LOP) to modify the IC design layout diagram 1722 according to manufacturing rules. Additionally, the processes applied to IC design layout diagram 1722 during data preparation 1732 can be executed in a variety of different orders.

After data preparation 1732 and during mask fabrication 1744, a mask 1745 or a group of masks 1745 are fabricated based on the modified IC design layout diagram 1722. In some embodiments, mask fabrication 1744 includes performing one or more lithographic exposures based on IC design layout diagram 1722. In some embodiments, an electron-beam (e-beam) or a mechanism of multiple e-beams is used to form a pattern on a mask (photomask or reticle) 1745 based on the modified IC design layout diagram 1722. Mask 1745 can be formed in various technologies. In some embodiments, mask 1745 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1745 includes a transparent substrate (e.g., fused quartz) and an opaque material (e.g., chromium) coated in the opaque regions of the binary mask. In another example, mask 1745 is formed using a phase shift technology. In a phase shift mask (PSM) version of mask 1745, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1773, and/or in other suitable processes.

IC fab 1750 includes wafer fabrication 1752. IC fab 1750 is an IC fabrication business that includes one or more manufacturing facilities for the fabrication of a variety of different IC products. In some embodiments, IC fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1750 uses mask(s) 1745 fabricated by mask house 1730 to fabricate IC device 1760. Thus, IC fab 1750 at least indirectly uses IC design layout diagram 1722 to fabricate IC device 1760. In some embodiments, semiconductor wafer 1753 is fabricated by IC fab 1750 using mask(s) 1745 to form IC device 1760. In some embodiments, the IC fabrication includes performing one or more lithographic exposures based at least indirectly on IC design layout diagram 1722. Semiconductor wafer 1753 includes a silicon substrate or other proper substrate having material layers formed thereon. Semiconductor wafer 1753 further includes one or more of various doped regions, dielectric features, and multilevel interconnect structures (formed at subsequent manufacturing steps).

The present disclosure describes semiconductor structures and methods to reduce wafer warpage due to stress caused by interconnect structures. The interconnect structures described herein include dummy metal lines arranged in a particular directional arrangement between consecutive metallization layers. For example, the dummy metal lines in a first metallization layer can have elongated sides that extend in a first direction. The dummy metal lines in a second metallization layer—directly above the first metallization layer—can have elongated sides that extend in a second direction perpendicular to the first direction. This directional arrangement of dummy metal lines among the metallization layers can be applied to two or more metallization layers, thus reducing tensile stress and stretching forces in the BEOL manufacturing process of semiconductor structures. As a result, wafer warpage can be reduced (e.g., by over 50%).

Embodiments of the present disclosure include a semiconductor structure with a substrate, a circuit element, a first metallization layer, and a second metallization layer. The circuit element is formed on the substrate. The first metallization layer is disposed over the substrate and includes a first metal line electrically connected to the circuit element and first dummy metal lines extending along a first direction and electrically isolated from the first metal line. The second metallization layer is disposed directly above the first metallization layer and includes a second metal line electrically connected to the first metal line and second dummy metal lines extending along a second direction and electrically isolated from the first metal line, the second metal line, and the first dummy metal lines. The second direction is perpendicular to the first direction.

Embodiments of the present disclosure include a semiconductor structure with a substrate, a circuit element, a first metallization layer, and a second metallization layer. The circuit element is formed on the substrate. The first metallization layer is disposed over the substrate and includes a first metal line electrically connected to the circuit element and first dummy metal lines extending along a first direction and electrically isolated from the first metal line. One or more of the first dummy metal lines includes a concave portion, a void structure, or combinations thereof. The second metallization layer is disposed directly above the first metallization layer and includes a second metal line electrically connected to the first metal line and second dummy metal lines extending along a second direction and electrically isolated from the second metal line. One or more of the second dummy metal lines includes a concave portion, a void structure, or combinations thereof. The second direction is perpendicular to the first direction.

Embodiments of the present disclosure include a method to generate interconnect structure layout patterns for a semiconductor device. The method includes: forming a circuit element on a substrate; forming first metal lines over the substrate and electrically connected to the circuit element; forming second metal lines directly above the first metal lines and electrically connected to the first metal lines; forming, between the first metal lines, first dummy metal lines that extend along a first direction; and forming, between the second metal lines, a second dummy metal lines that extend along a second direction perpendicular to the first direction.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a substrate including a circuit element formed thereon;

a first metallization layer disposed over the substrate and comprising:

a first metal line electrically connected to the circuit element; and a plurality of first dummy metal lines extending along a first direction and electrically isolated from the first metal line; and a second metallization layer disposed directly above the first metallization layer and comprising:

a second metal line electrically connected to the first metal line; and a plurality of second dummy metal lines directly above the plurality of first dummy metal lines, extending along a second direction, and electrically isolated from the first metal line, the second metal line, and the plurality of first dummy metal lines, wherein one or more of the plurality of second dummy metal lines comprise a concave portion, a void structure, or combinations thereof, and wherein the second direction is perpendicular to the first direction.

2. The semiconductor structure of claim 1, wherein an elongated side of the first metal line extends along the first direction and an elongated side of the second metal line extends along the second direction.

3. The semiconductor structure of claim 1, wherein a dummy metal line and an other dummy metal line of the plurality of first dummy metal lines are offset with respect to one another along the first direction.

4. The semiconductor structure of claim 3, wherein the offset is less than a length of the dummy metal line along the first direction.

5. The semiconductor structure of claim 1, wherein the first direction is in a direction along a non-zero angle relative to a horizontal direction.

6. The semiconductor structure of claim 1, wherein an elongated side of the first metal line extends along the second direction and an elongated side of the second metal line extends along the first direction.

7. The semiconductor structure of claim 1, wherein the first metallization layer further comprises an other plurality of first dummy metal lines extending along the second direction.

8. The semiconductor structure of claim 1, wherein a dummy metal line of the plurality of first dummy metal lines and an other dummy metal line of the plurality of first dummy metal lines have different widths.

9. A semiconductor structure, comprising:

a substrate including a circuit element formed thereon;

a first metallization layer disposed over the substrate and comprising:

a first metal line electrically connected to the circuit element; and a plurality of first dummy metal lines extending along a first direction and electrically isolated from the first metal line, wherein one or more of the plurality of first dummy metal lines comprise a concave portion, a void structure, or combinations thereof; and a second metallization layer disposed directly above the first metallization layer and comprising:

a second metal line electrically connected to the first metal line; and a plurality of second dummy metal lines directly above the plurality of first dummy metal lines, extending along a second direction, and electrically isolated from the second metal line and the plurality of first dummy metal lines, wherein one or more of the plurality of second dummy metal lines comprise the concave portion, the void structure, or combinations thereof, and wherein the second direction is perpendicular to the first direction.

10. The semiconductor structure of claim 9, wherein a length of an elongated side of the plurality of first dummy metal lines and a length of an elongated side of the plurality of second dummy metal lines is greater than a length of an elongated side of the first metal line and a length of an elongated side of the second metal line, respectively.

11. The semiconductor structure of claim 9, wherein a length of an elongated side of the plurality of first dummy metal lines and a length of an elongated side of the plurality of second dummy metal lines is less than a length of an elongated side of the first metal line and a length of an elongated side of the second metal line, respectively.

12. The semiconductor structure of claim 9, wherein the void structure comprises a dielectric material or air.

13. A method, comprising:

forming a circuit element on a substrate;

forming first metal lines over the substrate and electrically connected to the circuit element;

forming second metal lines directly above the first metal lines and electrically connected to the first metal lines;

forming, between the first metal lines, a plurality of first dummy metal lines that extend along a first direction; and forming, between the second metal lines, a plurality of second dummy metal lines that extend along a second direction perpendicular to the first direction, wherein the plurality of second dummy metal lines are directly above and isolated from the plurality of first dummy metal lines, wherein one or more of the plurality of second dummy metal lines comprise a concave portion, a void structure, or combinations thereof.

14. The method of claim 13, further comprising forming additional dummy metal lines between the first metal lines and the plurality of first dummy metal lines, between the second metal lines and the plurality of second dummy metal lines, or combinations thereof.

15. The method of claim 13, wherein forming the circuit element comprises forming a transistor device, a capacitor, or combinations thereof on the substrate.

16. The method of claim 13, wherein forming the first metal lines comprises routing the first metal lines with a spacing between two or more of the first metal lines.

17. The method of claim 16, wherein forming the plurality of first dummy metal lines comprises forming the plurality of first dummy metal lines in the spacing.

18. The method of claim 14, wherein forming the second metal lines comprises routing the second metal lines with a spacing between two or more of the second metal lines.

19. The method of claim 18, wherein forming the plurality of second dummy metal lines comprises forming the plurality of second dummy metal lines in the spacing.

20. The method of claim 13, wherein forming the plurality of first dummy metal lines and the plurality of second dummy metal lines comprises forming the plurality of first dummy metal lines with an elongated side perpendicular to an elongated side of the plurality of second dummy metal lines.

* * * * *